US006720222B2

United States Patent
Kanda et al.

(10) Patent No.: US 6,720,222 B2
(45) Date of Patent: Apr. 13, 2004

(54) METHOD OF MANUFACTURING SEMICONDUCTOR DEVICE

(75) Inventors: Atsushi Kanda, Suwa (JP); Yasushi Haga, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/271,589

(22) Filed: Oct. 17, 2002

(65) Prior Publication Data

US 2003/0082866 A1 May 1, 2003

(30) Foreign Application Priority Data

Oct. 26, 2001 (JP) ........................................ 2001-329038

(51) Int. Cl.⁷ .......................................... H01L 21/336
(52) U.S. Cl. ..................... 438/289; 438/194; 438/197
(58) Field of Search .............................. 438/194, 197, 438/266, 275, 289, 480, 770

(56) References Cited

U.S. PATENT DOCUMENTS 5,523,248 A  * 6/1996 Yamazaki .................. 438/480
6,267,479 B1 * 7/2001 Yamada et al. ............ 357/392
6,451,640 B1 * 9/2002 Ichikawa .................... 438/199

* cited by examiner

Primary Examiner—David Nhu
(74) Attorney, Agent, or Firm—Oliff & Berridge, PLC

(57) ABSTRACT

Among first and second oxide films 110 and 112 formed on a substrate 100, the oxide film in a low-breakdown-voltage transistor area LV is all etched off, while the whole surface of the oxide film in a high-breakdown-voltage transistor area HV is left intact. A sixth oxide film 119 for defining side walls is subsequently formed on the whole surface of the substrate 100 in a greater thickness of approximately 2000 angstrom than a standard thickness. Over-etching of the sixth oxide film 119 defines side walls 119SW. Non-required portions of the oxide film 112 are then etched off with a resist R15A. This causes a drain-source forming region, which is expected to form a drain area and a source area, to be open in an element forming region in a high-breakdown-voltage nMOS area HVn. The resist R15A is not removed but is used continuously, and an n-type impurity ion is implanted into the open drain-source forming region. This arrangement enables both a high-breakdown-voltage MOS transistor and a low-breakdown-voltage MOS transistor to be formed efficiently on an identical substrate without damaging the characteristics of the respective MOS transistors.

8 Claims, 43 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, in which both a high-breakdown-voltage MOS (Metal Oxide Semiconductor) transistor and a low-breakdown-voltage MOS transistor having different drain breakdown voltages are formed on an identical substrate.

2. Description of the Related Art

An integrated circuit for actuating, for example, an imaging element, an LCD (Liquid Crystal Display), or a print head (hereinafter referred to as the 'actuation IC') generally includes an actuation output module with a high-breakdown-voltage MOS transistor, which is driven by a power supply voltage of 10 or greater volts and has a high withstand voltage between a drain and a source (hereinafter may be referred to as the 'drain breakdown voltage'), and a logic module with a low-breakdown-voltage MOS transistor, which is driven by a power supply voltage of several or less volts and has a low drain breakdown voltage, for controlling the actuation output module. In the description below, the MOS transistor may be simply called the transistor.

In the actuation IC, it is preferable that the high-breakdown-voltage transistor and the low-breakdown-voltage transistor are formed on an identical substrate. The simplest method of forming such transistors of different withstand voltages on an identical substrate is to separately form the respective transistors according to different processes. The method first forms one of the high-breakdown-voltage transistor and the low-breakdown-voltage transistor on a substrate, and subsequently forms the other transistor on the same substrate.

The method of separately forming the high-breakdown-voltage transistor and the low-breakdown-voltage transistor, however, significantly increases the total number of manufacturing steps, thus worsening the production efficiency and increasing the manufacturing cost.

There is accordingly a demand for efficiently forming both a high-breakdown-voltage transistor and a low-breakdown-voltage transistor on an identical substrate without damaging the characteristics of the respective transistors.

SUMMARY OF THE INVENTION

The object of the present invention is thus to solve the drawback of the prior art technique discussed above and to provide a technique of efficiently forming both a high-breakdown-voltage transistor and a low-breakdown-voltage transistor on an identical substrate without damaging the characteristics of the respective transistors.

In order to attain at least part of the above and the other related objects, the present invention is directed to a method of manufacturing a semiconductor device, in which both a high-breakdown-voltage MOS transistor and a low-breakdown-voltage MOS transistor having different drain breakdown voltages are formed on an identical semiconductor substrate. The manufacturing method includes the steps of: (a) forming a gate electrode on a first dielectric film created above the substrate, creating a second dielectric film over surface of the substrate including the gate electrode, and etching the second dielectric film, so as to define a side wall of the second dielectric film on a side face of the gate electrode; and (b) implanting an impurity to specify a drain area and a source area, The step (b) includes the sub-steps of: (b-1) forming a first mask that keeps open at least a drain-source forming region in the high-breakdown-voltage MOS transistor, which is expected to form a drain area and a source area, and covers over at least an offset forming region in the high-breakdown-voltage MOS transistor, which is expected to form an offset area between the gate electrode and either one of the drain area and the source area; (b-2) using the first mask and etching off a dielectric film part at least on the drain-source forming region, out of the dielectric film created on the substrate; and (b-3) continuously using the same first mask and implanting the impurity into the drain-source forming region.

The manufacturing method of the present invention enables both the high-breakdown-voltage MOS transistor and the low-breakdown-voltage MOS transistor to be efficiently formed on an identical substrate. The arrangement of the manufacturing method effectively prevents the impurity ion from being implanted into a lower layer under the dielectric film in the vicinity of the gate electrode in the high-breakdown-voltage MOS transistor to define the drain area and the source area. This prevents a decrease in drain breakdown voltage and does not damage the voltage characteristics of the high-breakdown-voltage MOS transistor.

The manufacturing method of the invention continuously uses the same mask without any temporary detachment in the process of etching off the dielectric film on the drain-source forming region in the high-breakdown-voltage MOS transistor and in the process of implanting the impurity ion into the drain-source forming region. There is accordingly no possibility of positional shift of the mask. This arrangement thus ensures accurate implantation of the impurity into the target region.

In accordance with one preferable application of the manufacturing method, the step (a) creates the second dielectric film in a greater thickness than a predetermined standard thickness. The sub-step (b-1) forms the first mask that keeps open an element forming region in the low-breakdown-voltage MOS transistor, on which an element is to be generated, in addition to the drain-source forming region. The sub-step (b-3) implants the impurity into the element forming region as well as into the drain-source forming region.

In the manufacturing method of the invention, it is preferable that the predetermined standard thickness is approximately 1300 angstrom.

The above application enables implantation of the impurity into the drain-source forming region in the high-breakdown-voltage MOS transistor to be carried out simultaneously with implantation of the impurity into the element forming region in the low-breakdown-voltage MOS transistor. This arrangement desirably reduces the total number of processing steps.

The side wall is composed of the second dielectric film having a greater thickness than the standard thickness. Even if part of the side wall in the low-breakdown-voltage MOS transistor is etched off in the process of etching off the dielectric film on the drain-source forming region in the high-breakdown-voltage MOS transistor, this arrangement ensures a desired resulting film thickness required for the side wall.

The thicker second dielectric film for defining the side wall allows a decrease in resulting thickness of the remaining dielectric film in the high-breakdown-voltage MOS transistor on the substrate after etching. This arrangement reduces the amount of etching off the dielectric film on the drain-source forming region in the high-breakdown-voltage MOS transistor to open the drain-source forming region. Such reduction results in decreasing the amount of etching the side wall in the low-breakdown-voltage MOS transistor.

In accordance with another preferable application of the manufacturing method, the sub-step (b-1) forms the first mask that covers over an element forming region in the low-breakdown-voltage MOS transistor, on which an element is to be generated, in addition to the offset forming region. The step (b) further includes the sub-steps of: (b-4) forming a second mask that keeps open at least the element forming region in the low-breakdown-voltage MOS transistor; and (b-5) using the second mask and implanting the impurity into at least the element forming region.

The first mask, which also covers the element forming region in the low-breakdown-voltage MOS transistor, is used in the process of etching off the dielectric film on the drain-source forming region in the high-breakdown-voltage MOS transistor. The element forming region in the low-breakdown-voltage MOS transistor is accordingly not at all affected by etching. No part of the side wall is etched off in the low-breakdown-voltage MOS transistor.

The above arrangement also enables the thickness of the side wall composed of the second dielectric film to be regulated accurately.

In one preferable embodiment of the present invention, the manufacturing method further includes the step of: (c) forming a metal film on the gate electrode, the drain area, and the source area and carrying out heat treatment, so that at least part of semiconductor layers constructing the gate electrode, the drain area, and the source area is fused to a metal of the metal film and is thereby silicidated. The step (c) has the sub-step of: (c-1) generating a protective film at least over the offset forming region.

This arrangement effectively prevents silicidation of the semiconductor in the lower layer under the dielectric film in the vicinity of the gate electrode in the high-breakdown-voltage MOS transistor. The arrangement accordingly prevents a decrease in drain breakdown voltage due to silicidation of the semiconductor in the lower layer and does not damage the voltage characteristics of the high-breakdown-voltage MOS transistor.

These and other objects, features, aspects, and advantages of the present invention will become more apparent from the following detailed description of the preferred embodiments with the accompanying drawings.

DESCRIPTION OF THE PREFERRED EMBODIMENTS

Some modes of carrying out the invention are discussed below as preferred embodiments in the following sequence:
A. Prerequisite Basic Manufacturing Method
B. Structural Problems of High-breakdown-voltage Transistor Manufactured According to Basic Manufacturing Method
C. Manufacturing Method of First Embodiment
D. Manufacturing Method of Second Embodiment
E. Modification A. Prerequisite Basic Manufacturing Method A basic manufacturing method of a semiconductor device is described first, as a prerequisite for discussing a method of manufacturing a semiconductor device according to the present invention. FIGS. 1 through 28 are sectional views schematically illustrating a basic manufacturing method, as a basis of a method of manufacturing a semiconductor device according to the present invention. This manufacturing method is an exemplified procedure of forming both a high-breakdown-voltage CMOS (Complimentary Metal Oxide Semiconductor) transistor and a low-breakdown-voltage CMOS transistor on an identical substrate. In the respective drawings, a region HV represents a high-breakdown-voltage transistor area, and a region LV represents a low-breakdown-voltage transistor area. A region HVp denotes a high-breakdown-voltage p-channel MOS transistor (hereinafter the p-channel MOS transistor is simply referred to as 'pMOS') area, and a region HVn denotes a high-breakdown-voltage n-channel MOS transistor (hereinafter the n-channel MOS transistor is simply referred to as 'nMOS') area. A region LVp denotes a low-breakdown-voltage pMOS area, and a region LVn denotes a low-breakdown-voltage nMOS area.

Figure 1:
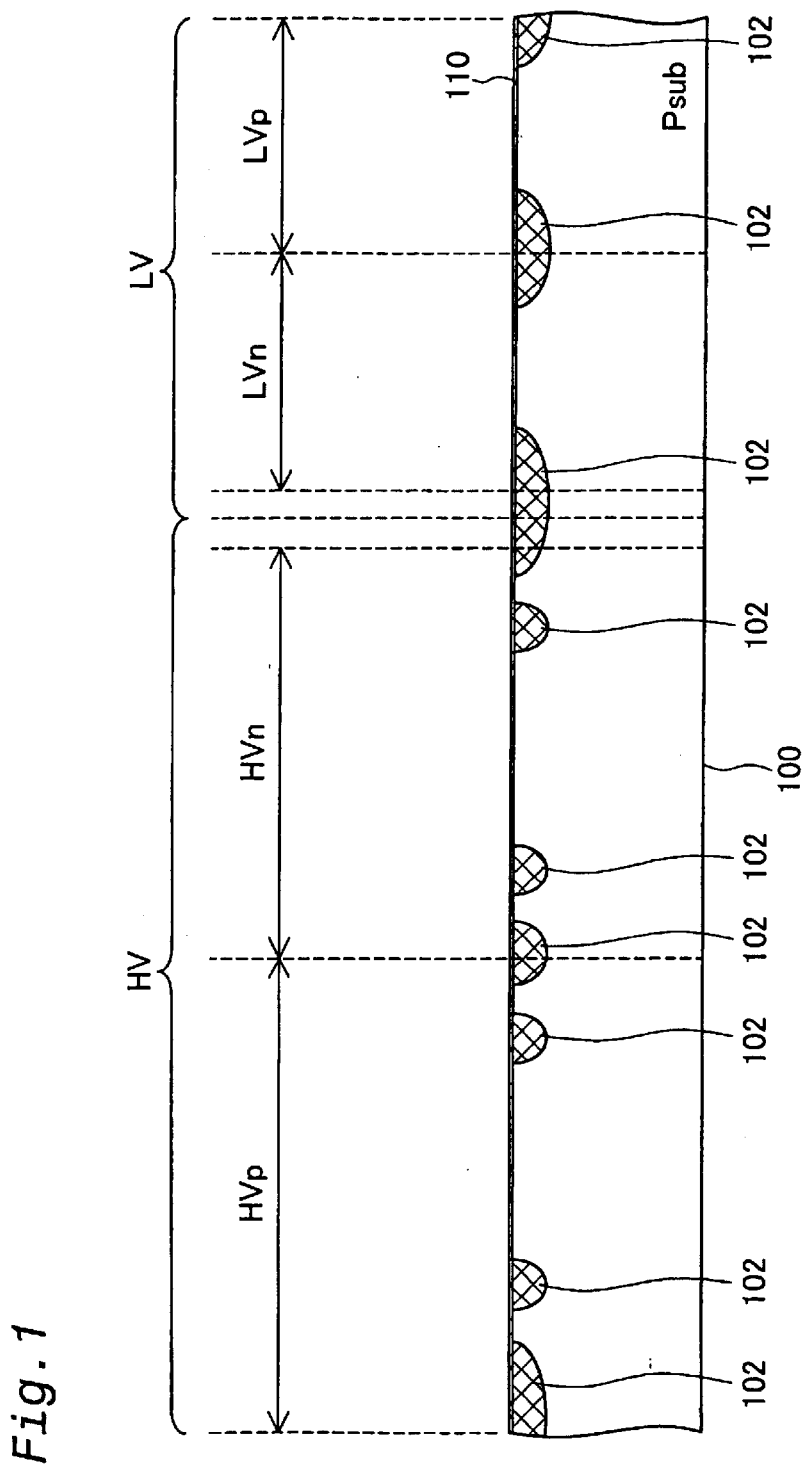
FIG. 1 is a sectional view schematically illustrating a process of forming a field oxide film on the surface of a field area.

The procedure first parts an element forming region from a residual part (hereinafter referred to as 'field part' or 'isolation part') on the semiconductor substrate and forms the element forming region in a restrictive manner. FIG. 1 is a sectional view schematically illustrating a process of forming a field oxide film on the surface of the field area. A field oxide film, LOCOS (Local Oxidation of Silicon) film 102 is formed on the surface of the field area of a p-type silicon (Si) substrate (Psub) 100 as shown in FIG. 1. In the description below, the p-type Si substrate is simply referred to as the 'substrate'. General photolithography is applied for formation of the LOCOS film 102. After formation of the LOCOS film 102, a first oxide film ($SiO_2$) 110 is formed over the whole surface of the substrate 100. The first oxide film 110 is formed, for example, by thermal oxidation of the surface of the substrate 100.

Figure 2:
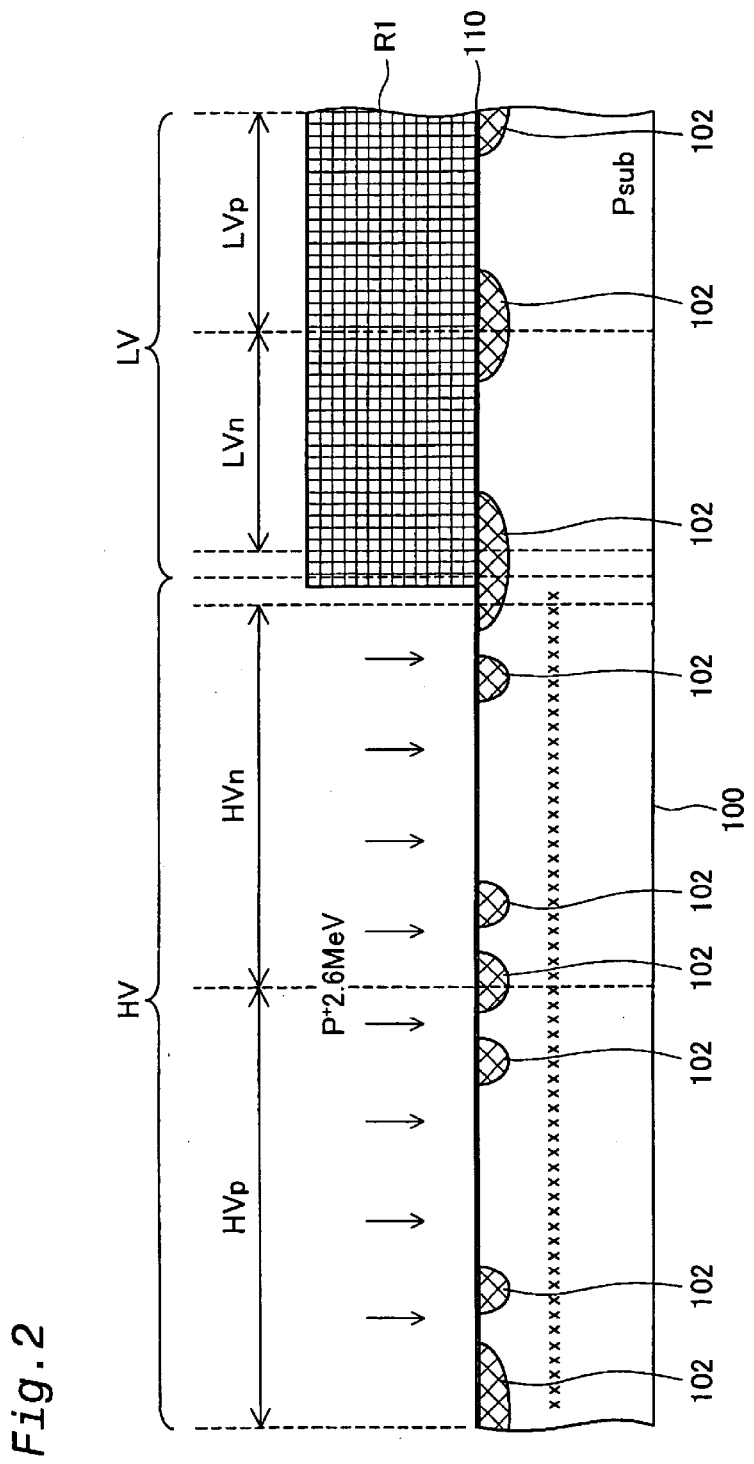
FIG. 2 is a sectional view schematically illustrating a process of forming an n well in a high-breakdown-voltage transistor area HV.
Figure 3:
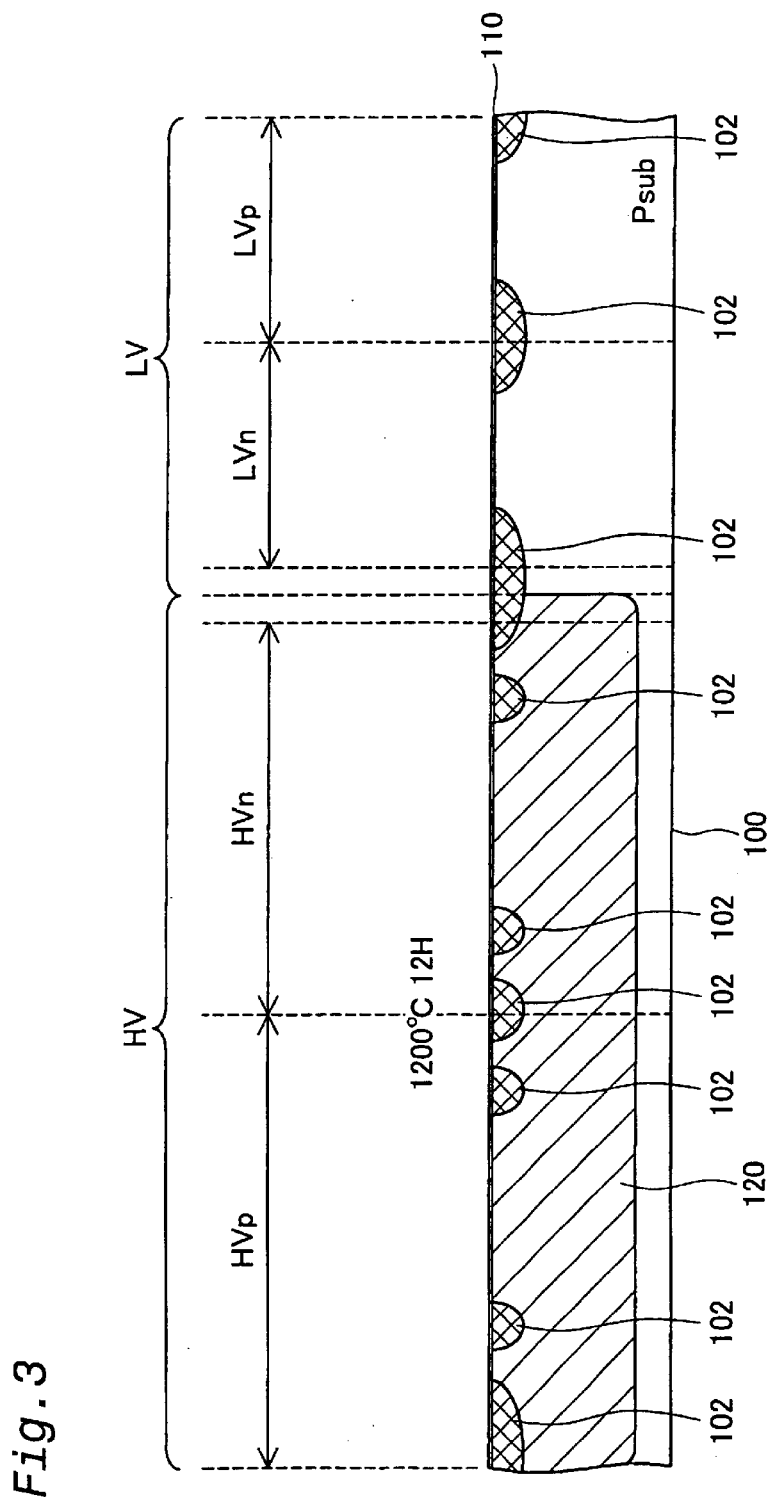
FIG. 3 is a sectional view schematically illustrating the process of forming the n well in the high-breakdown-voltage transistor area HV.

The procedure subsequently forms an n-type well (hereinafter simply referred to as 'n well') for formation of the high-breakdown-voltage pMOS in the high-breakdown-voltage transistor area HV. FIGS. 2 and 3 are sectional views schematically illustrating a process of forming an n well in the high-breakdown-voltage transistor area HV.

As shown in FIG. 2, the procedure forms a first resist R1 on a remaining area other than the high-breakdown-voltage transistor area HV. The general photolithography is applied for formation of the resist. The procedure then implants an n-type impurity ion into the opening of the first resist R1, that is, into the substrate 100 in the high-breakdown-voltage transistor area HV. In this and subsequent drawings, the symbol 'x' represents the implanted impurity. In this example, phosphorus ion ($P^+$) having an energy level of 2.6 MeV is implanted. The procedure subsequently removes the first resist R1 and carries out high-temperature heat treatment for a long time period, so as to diffuse the implanted n-type impurity ion (phosphorus) in the substrate 100 and form an n well 120 as shown in FIG. 3. In this example, the heat treatment is carried out at 1200° C. for 12 hours.

Figure 4:
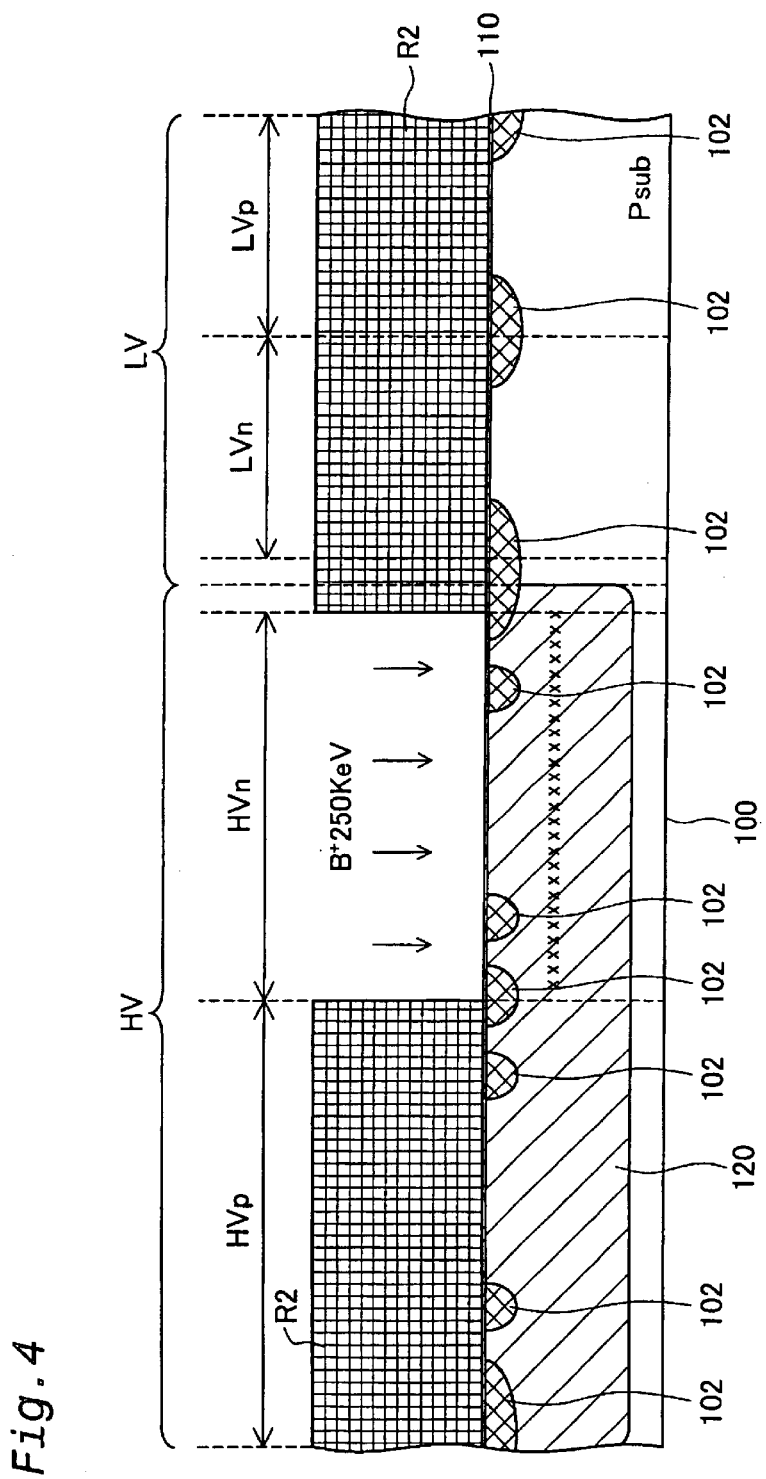
FIG. 4 is a sectional view schematically illustrating a process of forming a p well in the high-breakdown-voltage transistor area HV.
Figure 5:
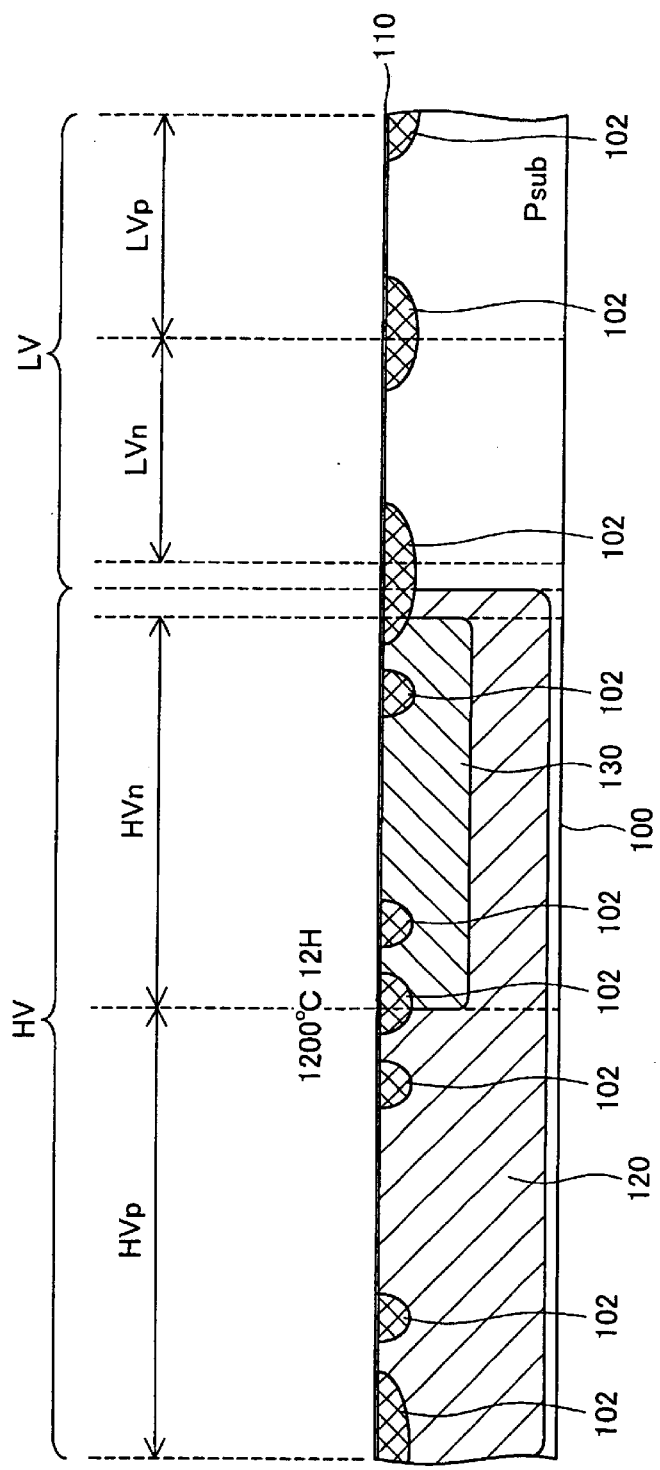
FIG. 5 is a sectional view schematically illustrating the process of forming the p well in the high-breakdown-voltage transistor area HV.

The procedure then forms a p-type well (hereinafter simply referred to as 'p well') for formation of the high-breakdown-voltage nMOS in the high-breakdown-voltage transistor area HV. FIGS. 4 and 5 are sectional views schematically illustrating a process of forming a p well in the high-breakdown-voltage transistor area HV.

As shown in FIG. 4, the procedure forms a second resist R2 on a remaining area other than the high-breakdown-voltage nMOS area HVn. The procedure then implants a p-type impurity ion into the opening of the second resist R2, that is, into the n well 120 in the high-breakdown-voltage nMOS area HVn. In this example, boron ion ($B^+$) having an energy level of 250 keV is implanted. The procedure subsequently removes the second resist R2 and carries out high-temperature heat treatment for a long time period, so as to diffuse the implanted p-type impurity ion (boron) in the n well 120 and form a p well 130 as shown in FIG. 5. In this example, the heat treatment is carried out at 1200° C. for 12 hours.

Figure 6:
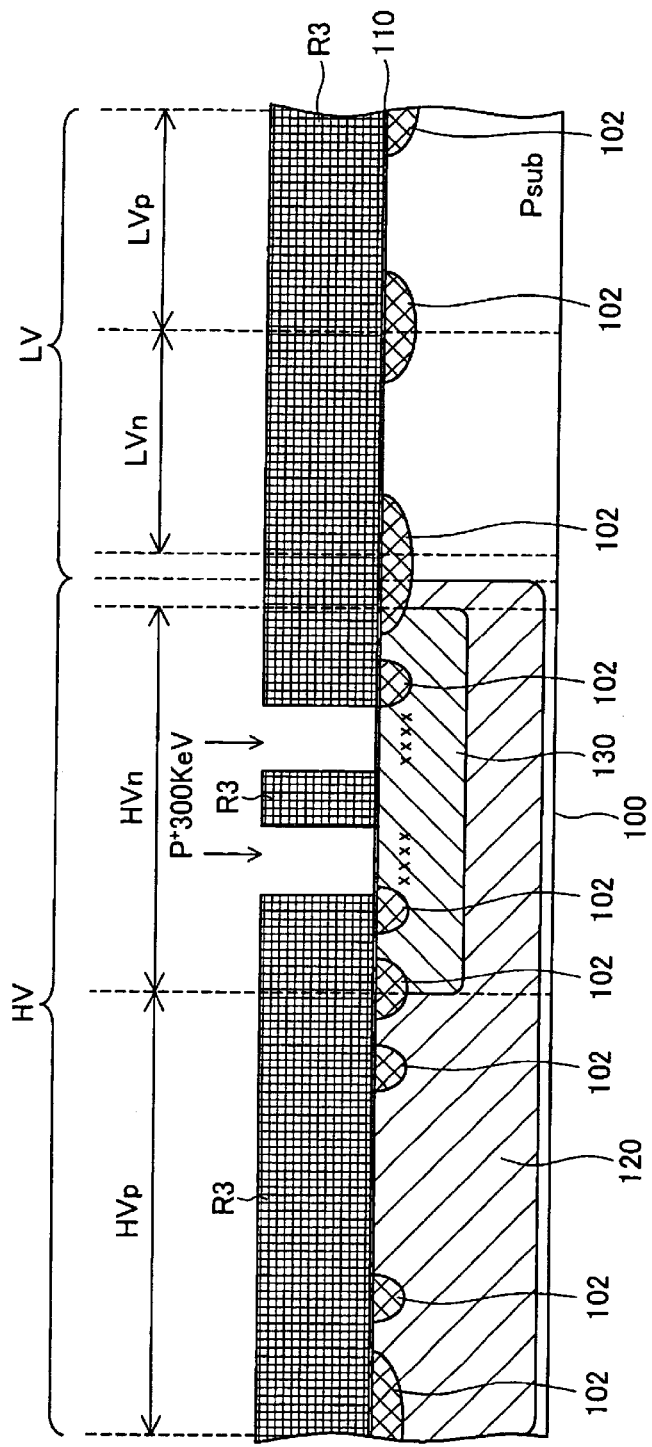
FIG. 6 is a sectional view schematically illustrating a process of forming drain and source offset areas of a high-breakdown-voltage transistor.
Figure 7:
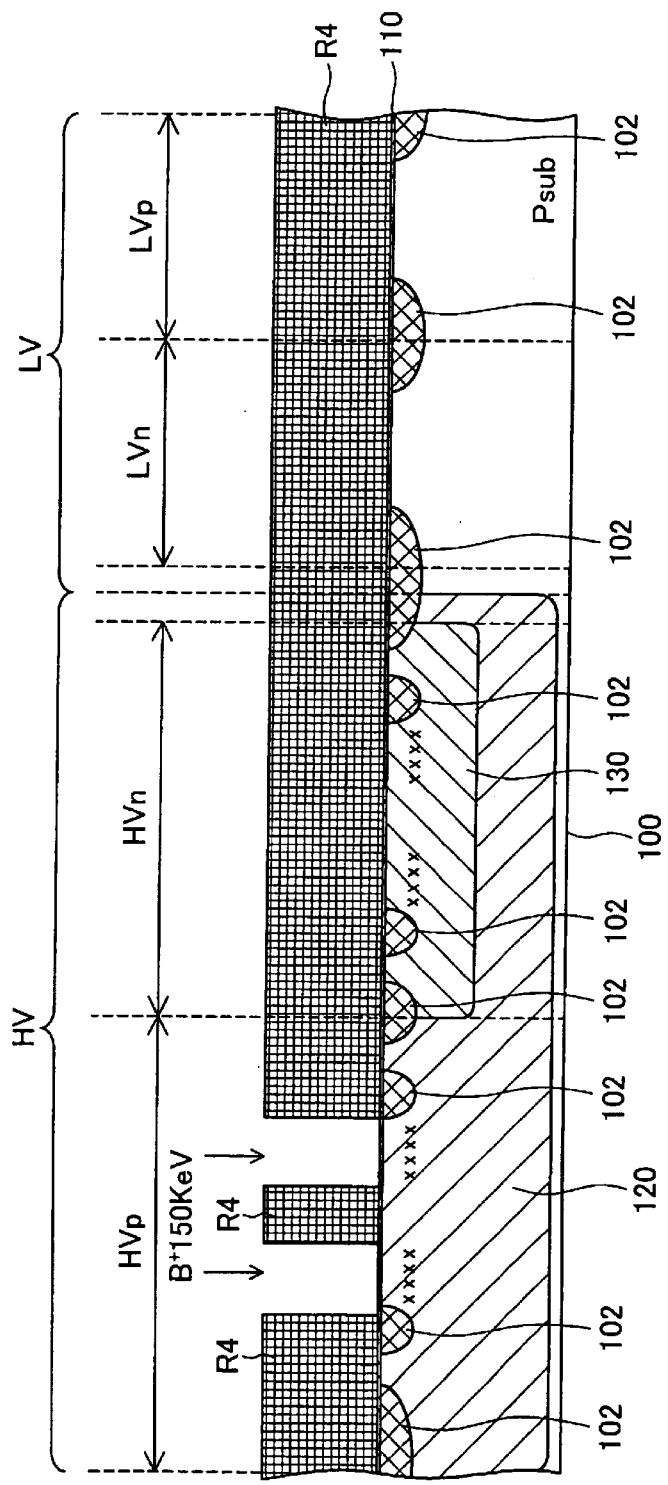
FIG. 7 is a sectional view schematically illustrating the process of forming the drain and source offset areas of the high-breakdown-voltage transistor.
Figure 8:
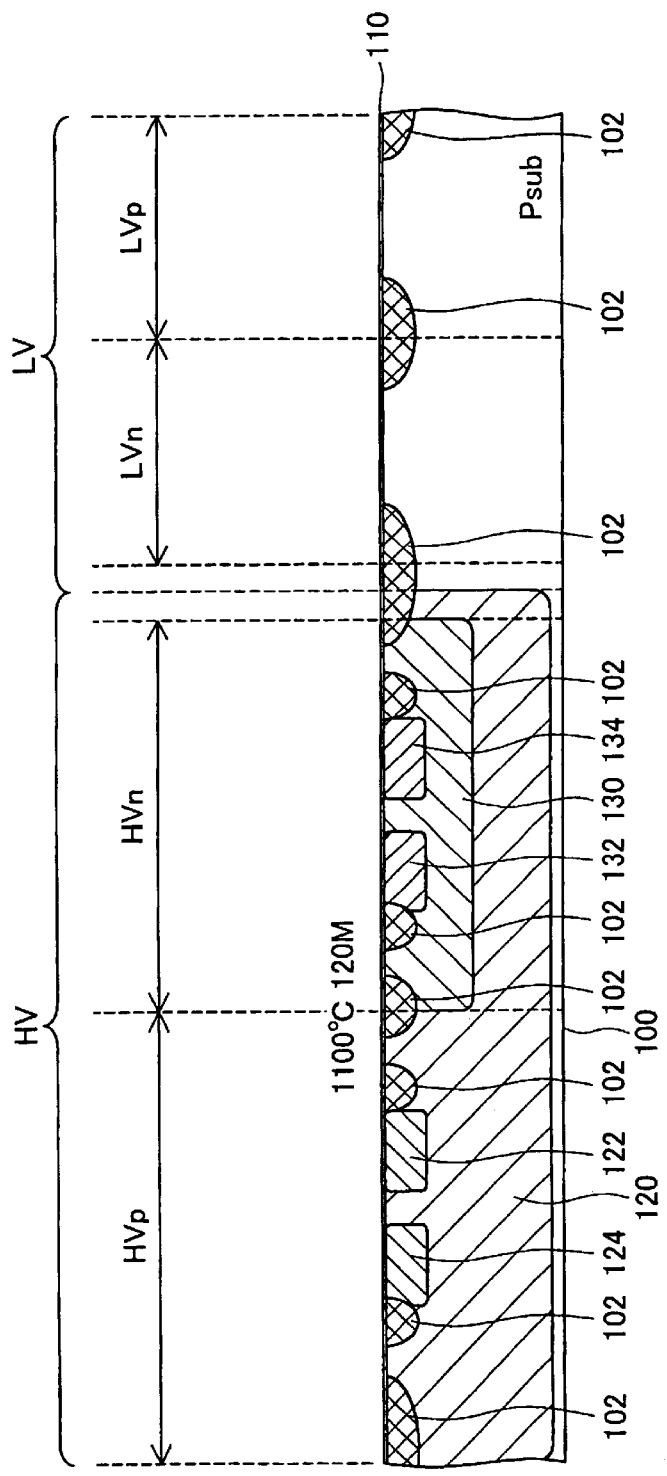
FIG. 8 is a sectional view schematically illustrating the process of forming the drain and source offset areas of the high-breakdown-voltage transistor.

The procedure then specifies a source offset area and a drain offset area (hereinafter may simply be referred to as 'offset area') for formation of a source area and a drain area of the high-breakdown-voltage transistor. FIGS. 6 through 8 are sectional views schematically illustrating a process of forming drain and source offset areas of the high-breakdown-voltage transistor.

Referring to FIG. 6, the procedure forms a third resist R3 on a remaining area other than specific parts corresponding to the drain and source offset areas of the high-breakdown-voltage nMOS. The procedure then implants an n-type impurity ion into the opening of the third resist R3, that is, into the p well 130 corresponding to the offset area of the high-breakdown-voltage nMOS. The third resist R3 is removed after the ion implantation. In this example, phosphorus ion ($P^+$) having an energy level of 300 keV is implanted.

Referring to FIG. 7, the procedure forms a fourth resist R4 on a remaining area other than specific parts corresponding to the drain and source offset areas of the high-breakdown-voltage pMOS. The procedure then implants a p-type impurity ion into the opening of the fourth resist R4, that is, into the n well 120 corresponding to the offset area of the high-breakdown-voltage pMOS. The fourth resist R4 is removed after the ion implantation. In this example, boron ion ($B^+$) having an energy level of 150 keV is implanted.

The ion implantation process shown in FIG. 6 and the ion implantation process shown in FIG. 7 may be carried out in the reverse order.

As shown in FIG. 8, the procedure carries out high-temperature heat treatment for a long time period to diffuse the implanted p-type impurity ion (boron) in the n well 120 and thereby define a drain offset area 122 and a source offset area 124 of the high-breakdown-voltage pMOS, while diffusing the implanted n-type impurity ion (phosphorus) in the p well 130 and thereby defining a drain offset area 132 and a source offset area 134 of the high-breakdown-voltage nMOS.

Figure 9:
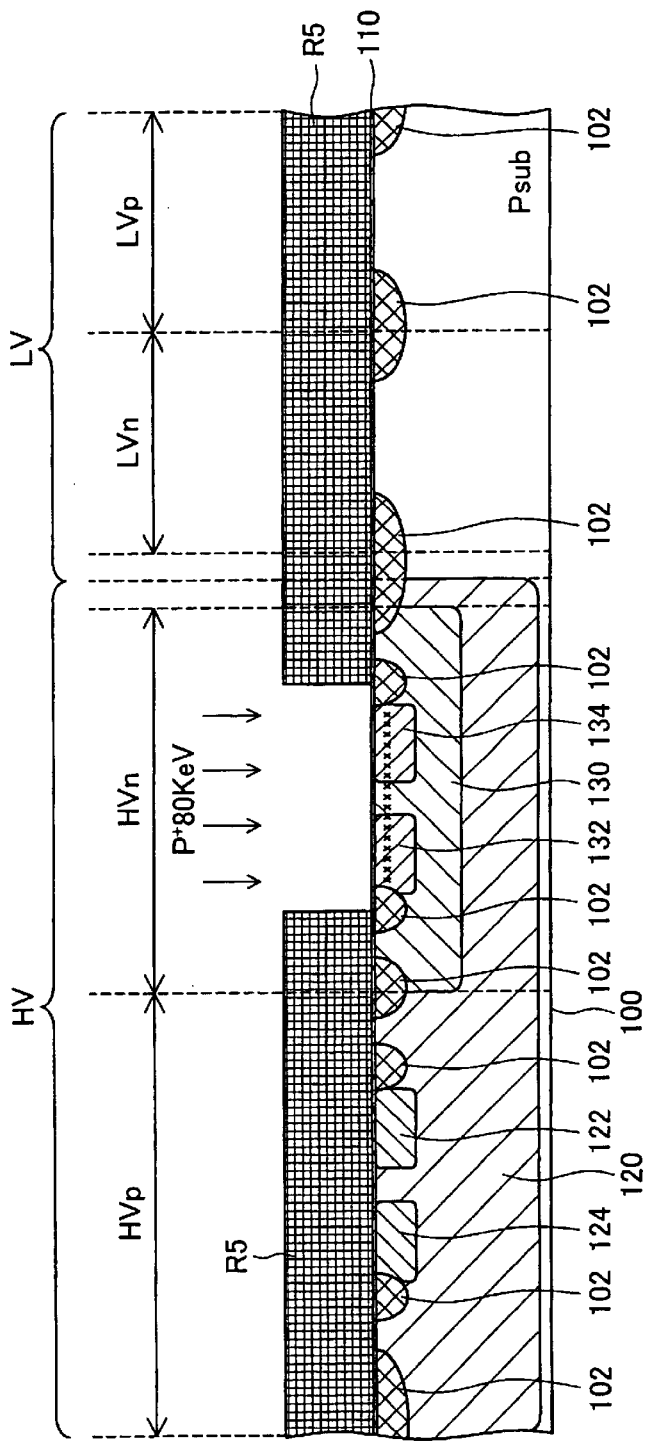
FIG. 9 is a sectional view schematically illustrating a process of implanting an n-type impurity ion into a channel area of a high-breakdown-voltage nMOS.
Figure 10:
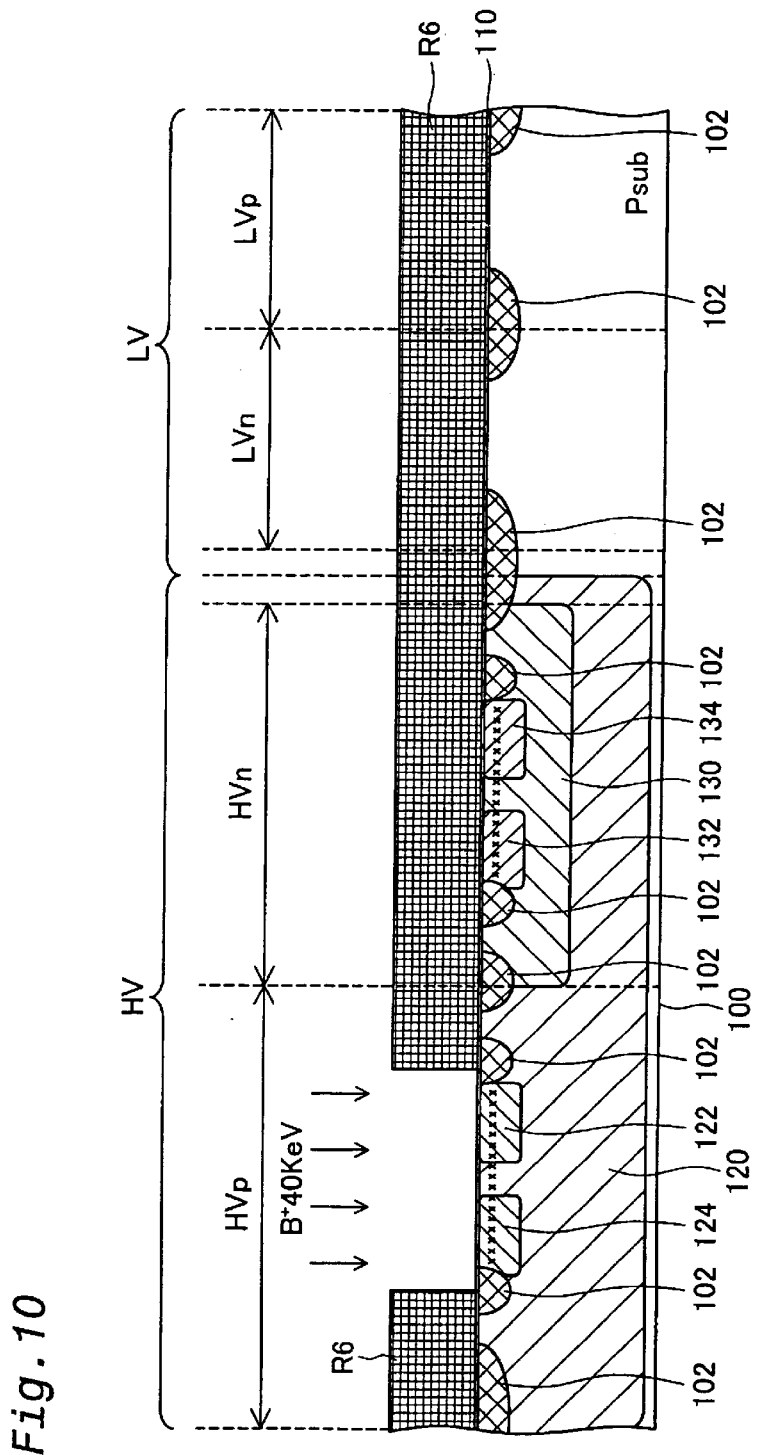
FIG. 10 is a sectional view schematically illustrating a process of implanting a p-type impurity ion into a channel area of a high-breakdown-voltage pMOS.

The procedure subsequently implants an impurity ion in a channel area, in order to regulate a threshold voltage of the high-breakdown-voltage transistor. FIG. 9 is a sectional view schematically illustrating a process of implanting an n-type impurity ion into a channel area of the high-breakdown-voltage nMOS. FIG. 10 is a sectional view schematically illustrating a process of implanting a p-type impurity ion into a channel area of the high-breakdown-voltage pMOS.

Referring to FIG. 9, the procedure forms a fifth resist R5 on a remaining area other than the high-breakdown-voltage nMOS area HVn, and implants an n-type impurity ion into the opening of the fifth resist R5, that is, into the channel area to regulate the threshold voltage of the high-breakdown-voltage nMOS. In this example, phosphorus ion ($P^+$) having an energy level of 80 keV is implanted. The fifth resist R5 is removed after the ion implantation.

Referring to FIG. 10, the procedure forms a sixth resist R6 on a remaining area other than the high-breakdown-voltage pMOS area HVp, and implants a p-type impurity ion into the opening of the sixth resist R6, that is, into the channel area to regulate the threshold voltage of the high-breakdown-voltage pMOS. In this example, boron ion ($B^+$) having an energy level of 40 keV is implanted. The sixth resist R6 is removed after the ion implantation.

The ion implantation process shown in FIG. 9 and the ion implantation process shown in FIG. 10 may be carried out in the reverse order.

Figure 11:
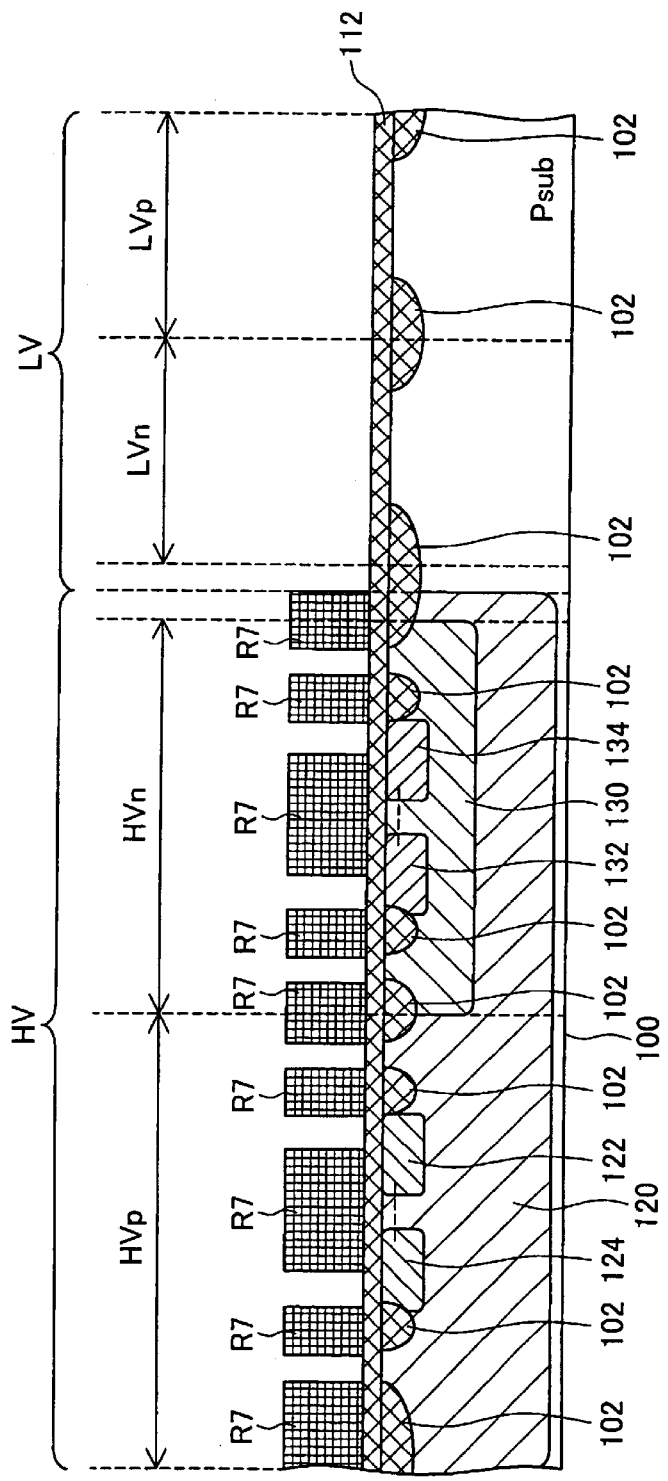
FIG. 11 is a sectional view schematically illustrating a process of forming a gate oxide film of the high-breakdown-voltage transistor.
Figure 12:
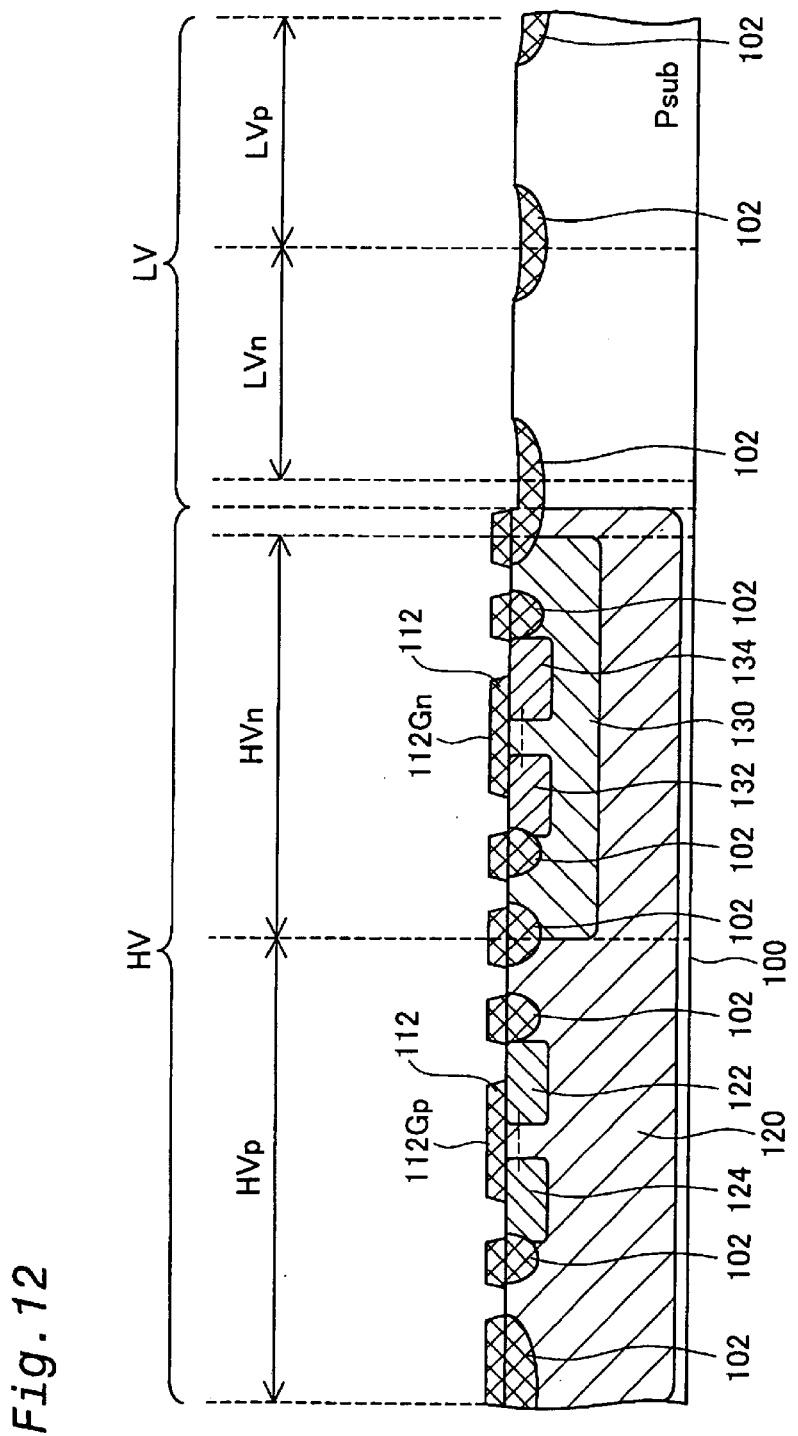
FIG. 12 is a sectional view schematically illustrating the process of forming the gate oxide film of the high-breakdown-voltage transistor.

The procedure subsequently forms a gate oxide film of the high-breakdown-voltage transistor. FIGS. 11 and 12 are sectional views schematically illustrating a process of forming a gate oxide film of the high-breakdown-voltage transistor.

As shown in FIG. 11, the procedure etches the whole surface to remove the first oxide film 110 and forms a second oxide film 112 by thermal oxidation as a gate oxide film of the high-breakdown-voltage transistor. The procedure subsequently forms a seventh resist R7 for protection of a required area as the gate oxide film, and etches off a non-required portion of the second oxide film 112 in the opening of the seventh resist R7. This gives a gate oxide film 112Gn for the high-breakdown-voltage nMOS and a gate oxide film 112Gp for the high-breakdown-voltage pMOS as shown in FIG. 12. In FIGS. 11 and 12 and subsequent drawings, the broken lines represent the channel areas of the high-breakdown-voltage nMOS and the high-breakdown-voltage pMOS.

Both of the gate oxide films 112Gp and 112Gn are composed of the second oxide film 112 formed by thermal oxidation. The final gate oxide film has a structure including another oxide film formed by thermal oxidation in the subsequent process. In this embodiment, the second oxide film 112 is formed by thermal oxidation to make the resulting gate oxide films 112Gp and 112Gn have a thickness of approximately 700 angstrom.

Figure 13:
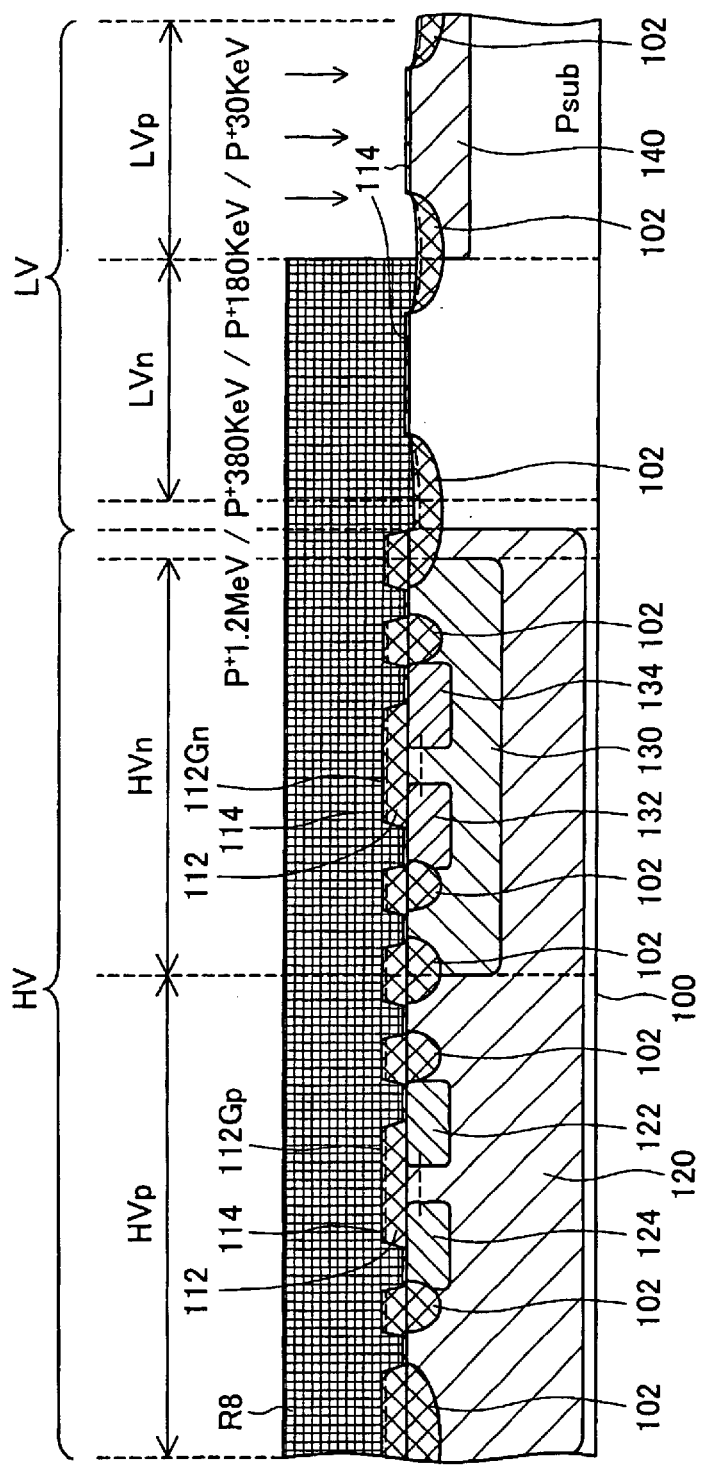
FIG. 13 is a sectional view schematically illustrating a process of forming an n well in a low-breakdown-voltage pMOS area LVp.

The procedure subsequently forms an n well for formation of the low-breakdown-voltage pMOS in the low-breakdown-voltage pMOS area LVp of the low-breakdown-voltage transistor area LV. FIG. 13 is a sectional view schematically illustrating a process of forming an n well in the low-breakdown-voltage pMOS area LVp.

Referring to FIG. 13, the procedure forms a third oxide film 114 by thermal oxidation as a sacrificial oxide film over the whole surface of the substrate 100, and forms an eighth resist R8 on a remaining area other than the low-breakdown-voltage pMOS area LVp. The procedure subsequently implants an n-type impurity ion into the opening of the eighth resist R8, that is, into the substrate 100 in the low-breakdown-voltage pMOS area LVp to form an n well 140. In this example, phosphorus ion (P$^+$) having four different energy levels of 1.2 MeV, 380 keV, 180 keV, and 30 keV is implanted to form the n well 140. The eighth resist R8 is removed after the ion implantation.

Figure 14:
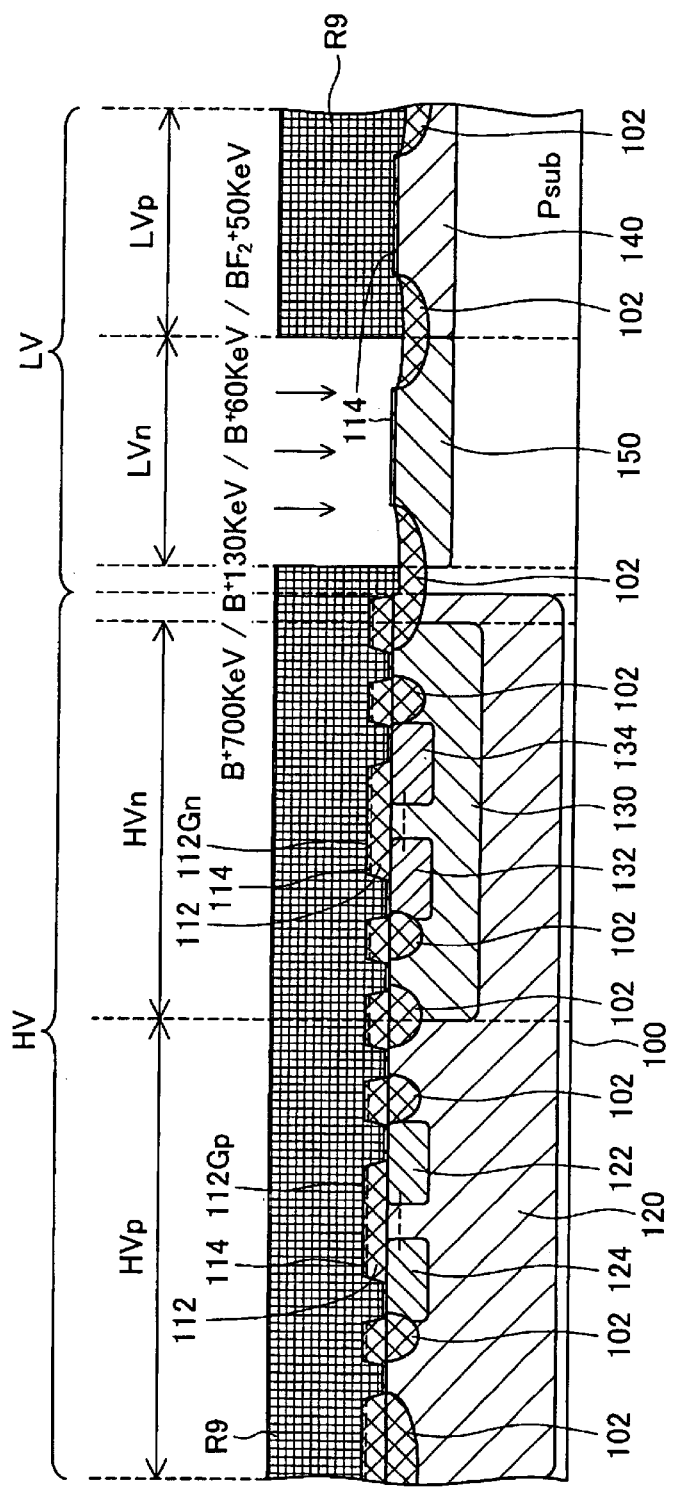
FIG. 14 is a sectional view schematically illustrating a process of forming a p well in a low-breakdown-voltage nMOS area LVn.

The procedure forms a p well for formation of the low-breakdown-voltage nMOS in the low-breakdown-voltage nMOS area LVn of the low-breakdown-voltage transistor area LV. FIG. 14 is a sectional view schematically illustrating a process of forming a p well in the low-breakdown-voltage nMOS area LVn.

Referring to FIG. 14, the procedure forms a ninth resist R9 on a remaining area other than the low-breakdown-voltage nMOS area LVn, and implants a p-type impurity ion into the opening of the ninth resist R9, that is, into the substrate 100 in the low-breakdown-voltage nMOS area LVn to form a p well 150. In this example, boron ion (B$^+$) having three different energy levels of 700 keV, 130 keV, and 60 keV and boron fluoride ion (BF$_2^+$) having an energy level of 50 keV are implanted to form the p well 150. The ninth resist R9 is removed after the ion implantation.

The process of forming the n well 140 shown in FIG. 13 and the process of forming the p well 150 shown in FIG. 14 may be carried out in the reverse order.

At the time of terminating the processes of FIGS. 13 and 14, the gate oxide film 112Gn of the high-breakdown-voltage nMOS and the gate oxide film 112Gp of the high-breakdown-voltage pMOS are composed of the second and the third oxide films 112 and 114. In this example, the third oxide film 114 is formed by thermal oxidation to have a thickness of approximately 100 angstrom. The gate oxide film 112Gn of the high-breakdown-voltage nMOS and the gate oxide film 112Gp of the high-breakdown-voltage pMOS are formed in a thickness of approximately 760 to 770 angstrom.

Figure 15:
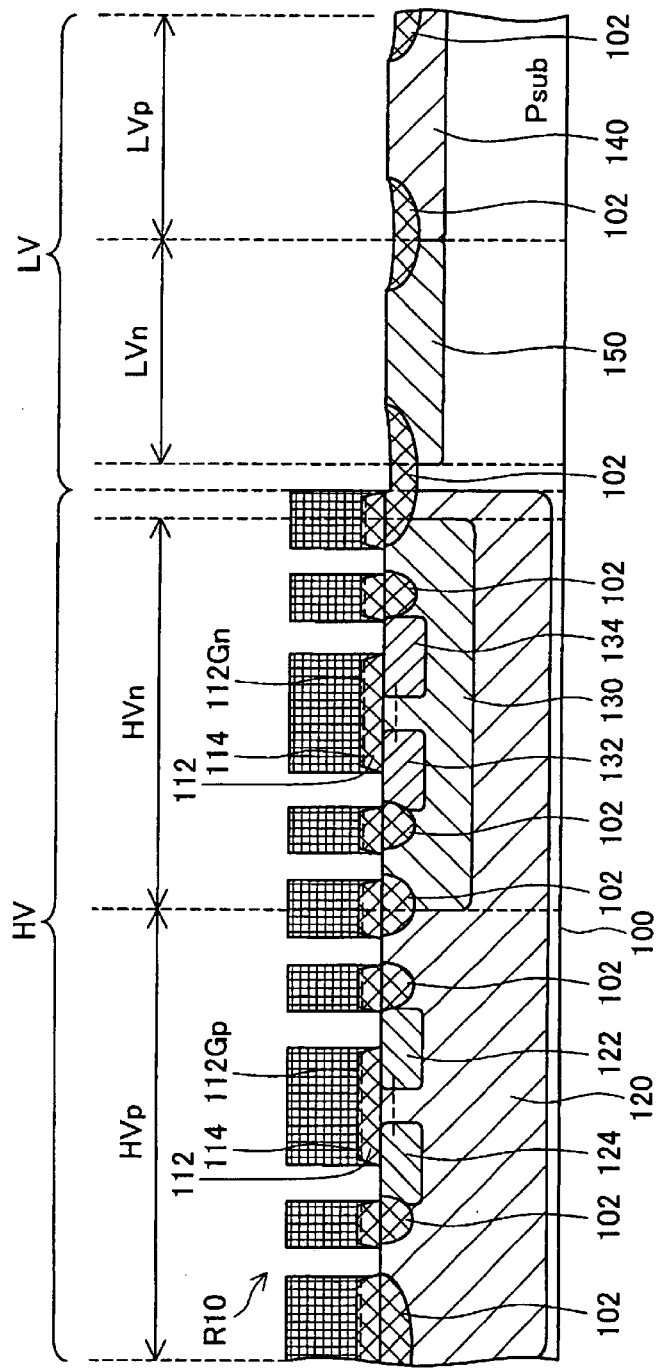
FIG. 15 is a sectional view schematically illustrating a process of forming a gate oxide film of a low-breakdown-voltage transistor.
Figure 16:
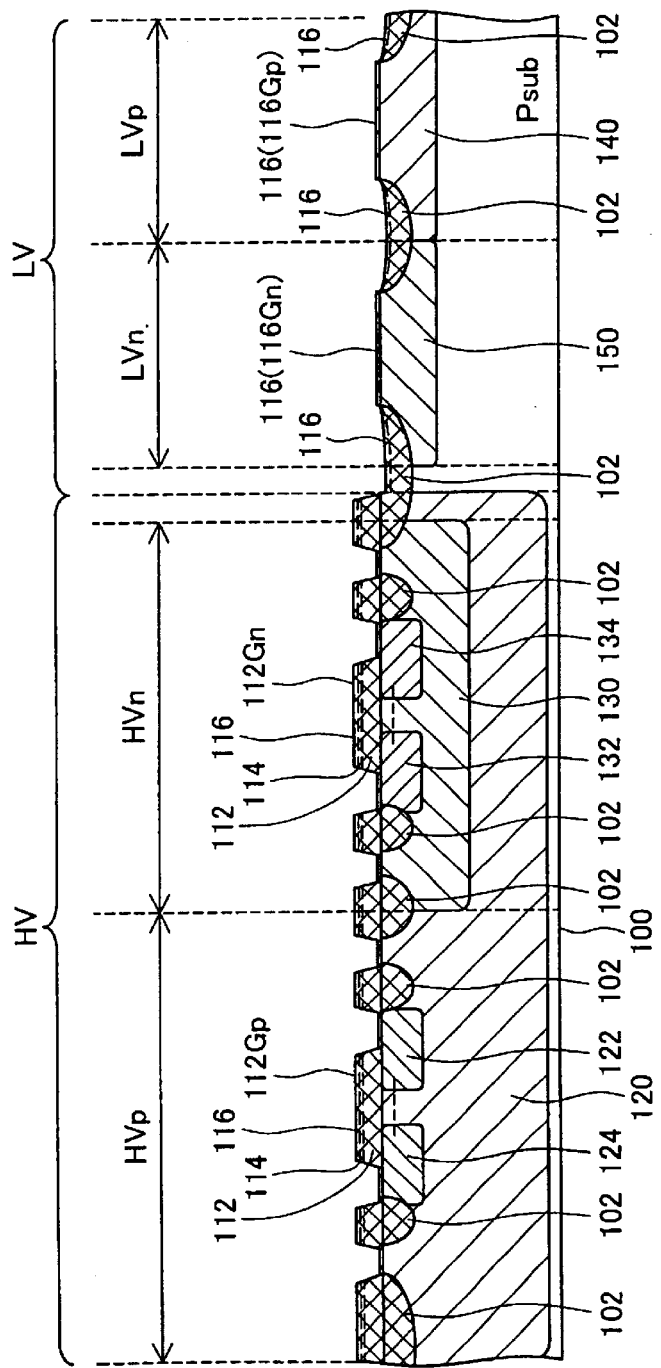
FIG. 16 is a sectional view schematically illustrating the process of forming the gate oxide film of the low-breakdown-voltage transistor.

The procedure subsequently forms a gate oxide film of the low-breakdown-voltage transistor. FIGS. 15 and 16 are sectional views schematically illustrating a process of forming a gate oxide film of the low-breakdown-voltage transistor.

As shown in FIG. 15, the procedure forms a tenth resist R10 and etches off non-required portions of the third oxide film 114. The procedure subsequently removes the tenth resist R10 and forms a fourth oxide film 116 over the whole surface of the substrate 100 by thermal oxidation as shown in FIG. 16. The fourth oxide film 116 formed on the element forming regions (that is, specific areas interposed between the LOCOS-film parts 102) in the low-breakdown-voltage nMOS area LVn and the low-breakdown-voltage pMOS area LVp gives gate oxide films 116Gn and 116Gp of the low-breakdown-voltage transistor.

The gate oxide film 112Gn of the high-breakdown-voltage nMOS and the gate oxide film 112Gp of the high-breakdown-voltage pMOS are composed of the second through the fourth oxide films 112, 114, and 116. In this example, the fourth oxide film 116 is formed by thermal oxidation in a thickness of approximately 70 angstrom. The gate oxide film 112Gn of the high-breakdown-voltage nMOS and the gate oxide film 112Gp of the high-breakdown-voltage pMOS are formed in a thickness of approximately 800 angstrom.

Figure 17:
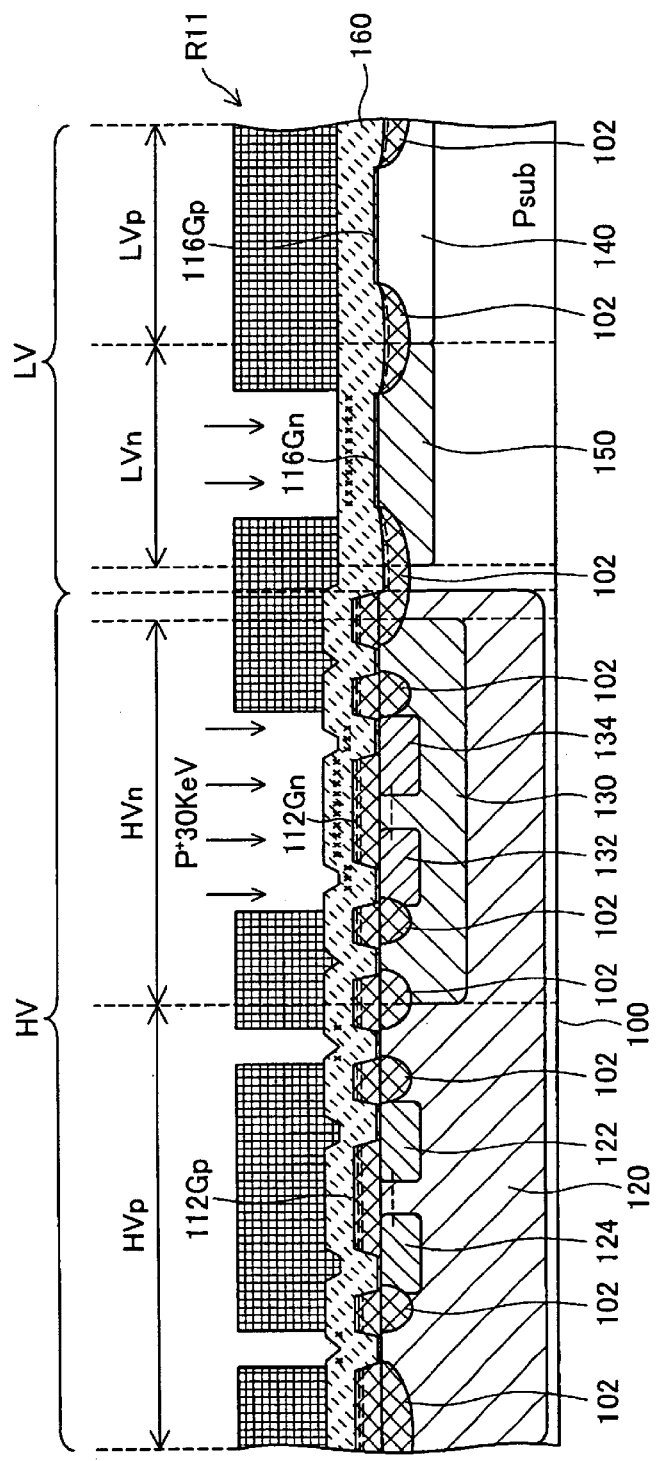
FIG. 17 is a sectional view schematically illustrating a process of forming gate electrodes of the high-breakdown-voltage transistor and the low-breakdown-voltage transistor.
Figure 18:
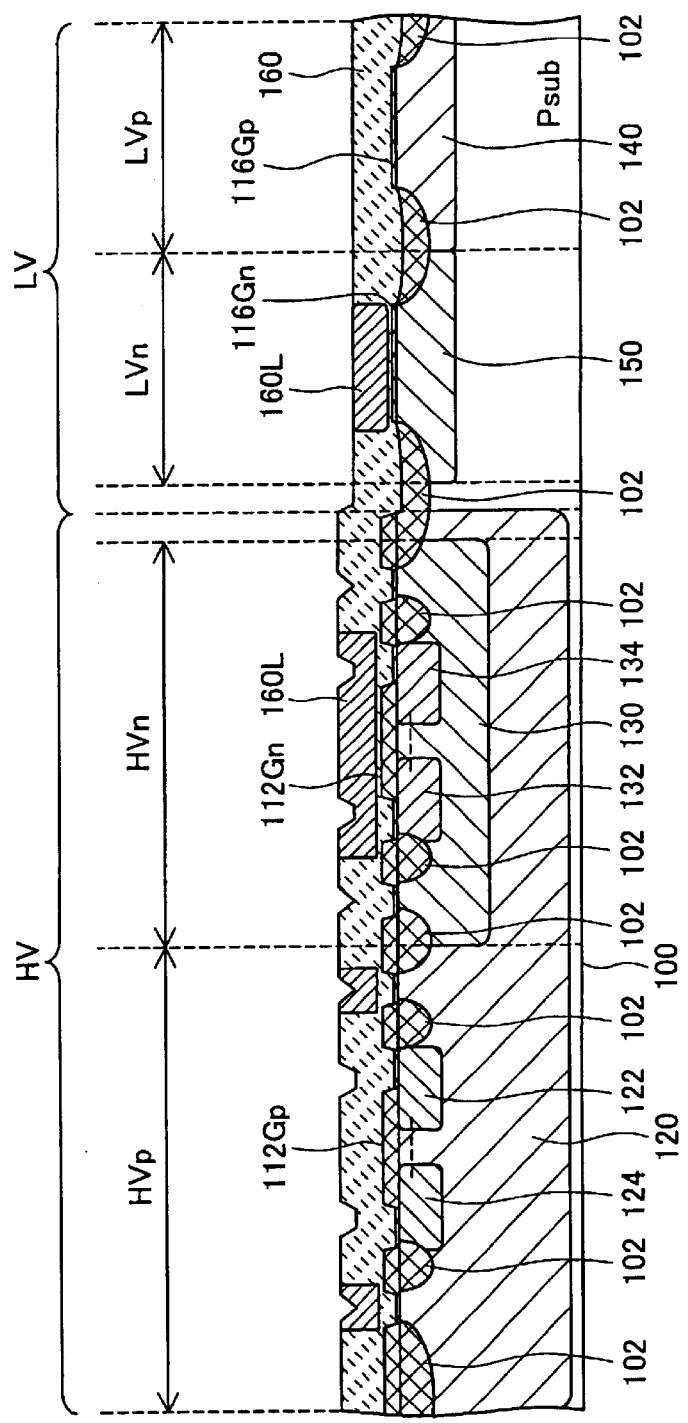
FIG. 18 is a sectional view schematically illustrating the process of forming the gate electrodes of the high-breakdown-voltage transistor and the low-breakdown-voltage transistor.
Figure 19:
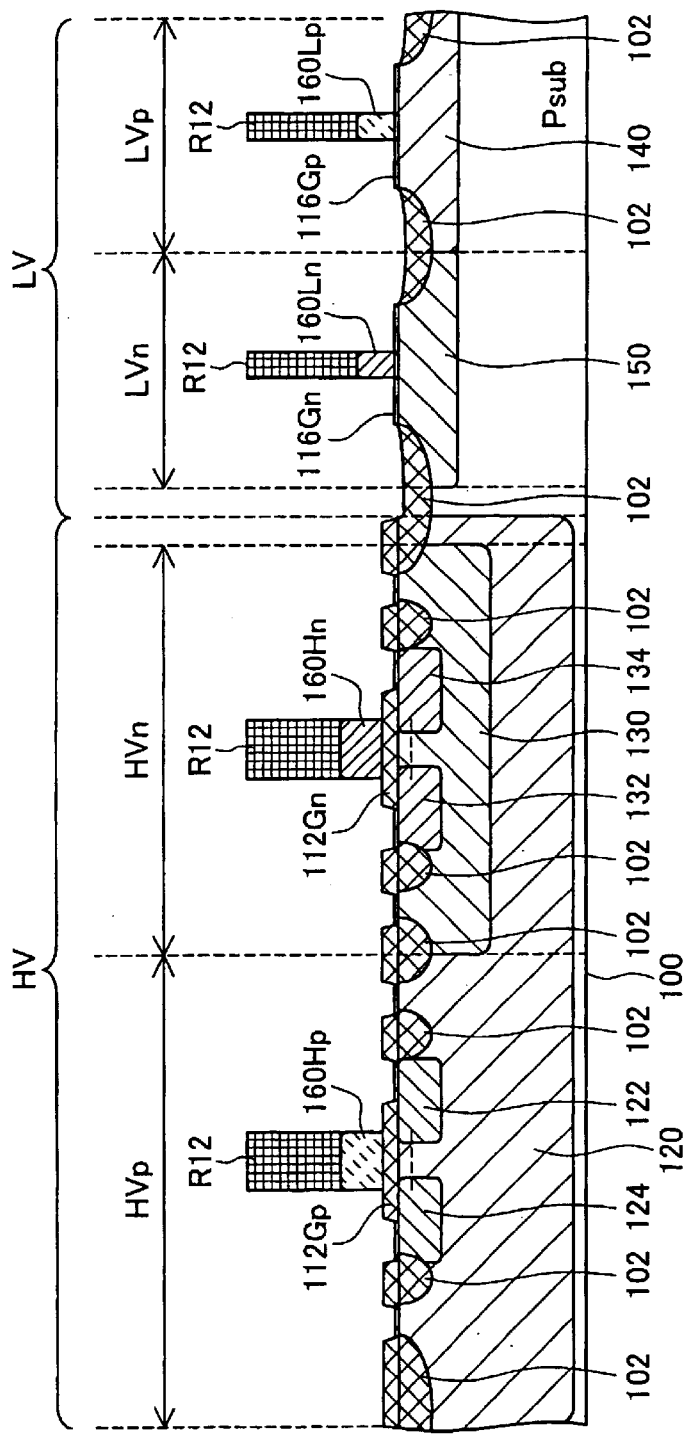
FIG. 19 is a sectional view schematically illustrating the process of forming the gate electrodes of the high-breakdown-voltage transistor and the low-breakdown-voltage transistor.

The procedure subsequently forms gate electrodes of the high-breakdown-voltage transistor and the low-breakdown-voltage transistor. FIGS. 17 through 19 are sectional views schematically illustrating a process of forming gate electrodes of the high-breakdown-voltage transistor and the low-breakdown-voltage transistor.

Referring to FIG. 17, the procedure makes a polysilicon (polySi) film 160 for gate electrodes deposit over the whole surface of the substrate 100, and forms an eleventh resist R11 on a remaining area other than gate electrode-forming areas of the high-breakdown-voltage nMOS and the low-breakdown-voltage nMOS. The procedure subsequently implants an n-type impurity ion into the opening of the eleventh resist R11, that is, into the polySi film 160 in the gate electrode-forming areas of the high-breakdown-voltage nMOS and the low-breakdown-voltage nMOS. In this example, phosphorus ion (P$^+$) having an energy level of 30 keV is implanted. The procedure then removes the eleventh resist R11 and carries out heat treatment to diffuse the implanted n-type impurity ion (phosphorus) as shown in FIG. 18.

The procedure then forms a twelfth resist R12 on the gate electrode-forming areas of the respective transistors as shown in FIG. 19, and etches off non-required portions of the polySi film 160, which are not protected by the twelfth resist R12. This gives a gate electrode 160Hp of the high-breakdown-voltage pMOS, a gate electrode 160Hn of the high-breakdown-voltage nMOS, a gate electrode 160Lp of the low-breakdown-voltage pMOS, and a gate electrode 160Ln of the low-breakdown-voltage nMOS.

The resistance of the polySi material is higher than those of general metal materials applicable for the electrodes. In the case where the polySi material is applied for the gate electrodes, impurity ions adequate for the respective channels should be implanted to lower the resistance. In a process of FIG. 24 discussed later, an n-type impurity ion is implanted into drain and source areas of the nMOS as well as into corresponding gate electrodes. The quantity of ion implantation in this process alone is, however, not sufficient for the gate electrodes of the nMOS and can not sufficiently lower the resistance. The process shown in FIGS. 17 and 18 thus preliminarily lowers the resistance of polySi areas 160H and 160L corresponding to the gate electrodes of the nMOS.

The eleventh resist R11 shown in FIG. 17 has the openings not only in the portions corresponding to the gate electrode-forming areas but in portions corresponding to non-gate electrode-forming areas. This is because the resist R11 is formed with the same resist mask as the resist mask used for formation of a fifteenth resist R15 in the process of ion implantation into drain and source areas shown in FIG. 24 discussed below. Such openings of the eleventh resist R11 in the non-gate electrode-forming areas, however, do not cause any problems, since the polySi film in the non-gate electrode-forming areas is etched off as shown in FIG. 19. An exclusive mask may alternatively be used not to make the openings of the eleventh resist R11 in the non-gate electrode-forming areas.

Figure 20:
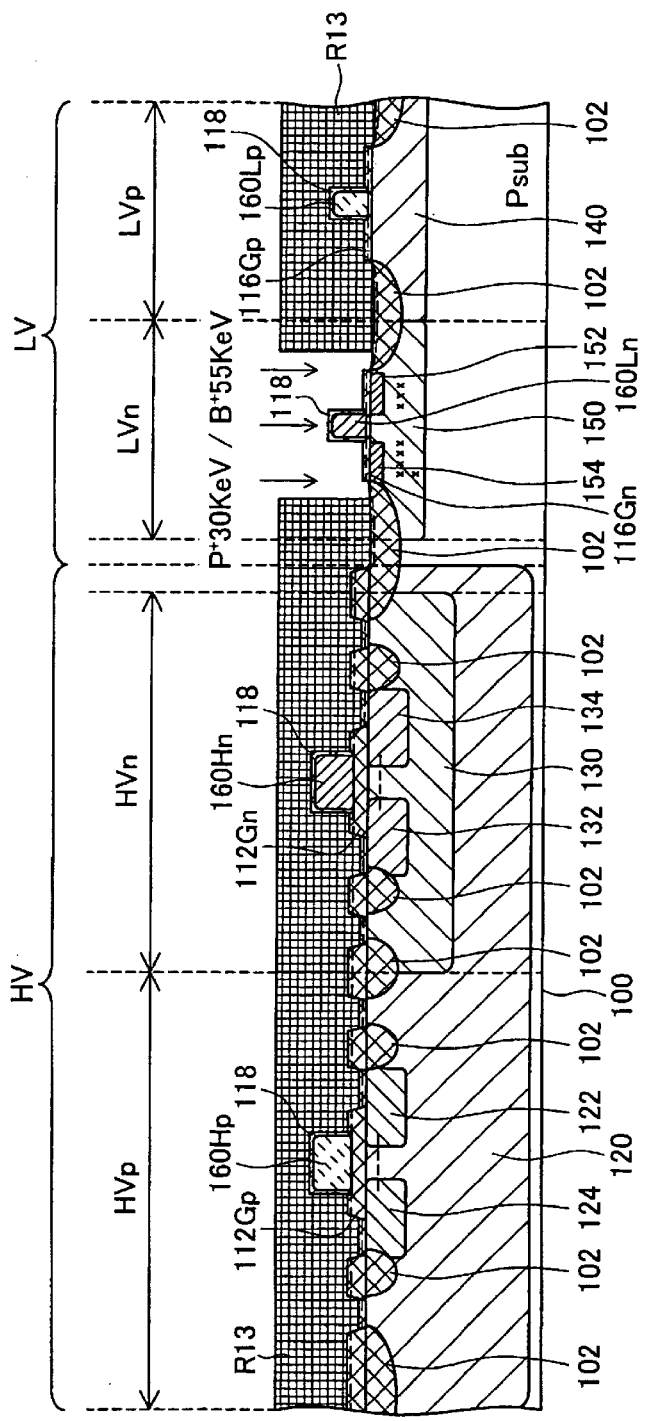
FIG. 20 is a sectional view schematically illustrating a process of forming source and drain offset areas of the low-breakdown-voltage nMOS.

The procedure then forms source and drain offset areas of the low-breakdown-voltage nMOS on the substrate surface side of the p well 150. FIG. 20 is a sectional view schematically illustrating a process of forming source and drain offset areas of the low-breakdown-voltage nMOS.

As shown in FIG. 20, the procedure forms a fifth oxide film 118 over the whole surface of the substrate 100 by thermal oxidation. The procedure then forms a thirteenth resist R13 on a remaining area other than the low-breakdown-voltage nMOS area LVn and implants an n-type impurity ion into a shallower portion of the p well 150. In this example, phosphorus ion ($P^+$) having an energy level of 30 keV is implanted as the n-type impurity ion. This makes a drain offset area 152 and a source offset area 154 for defining a drain area and a source area.

The procedure subsequently implants a p-type impurity ion into a deeper portion of the p well 150. In this example, boron ion ($B^+$) having an energy level of 55 keV is implanted as the p-type impurity ion. The concentration of the n-type impurity ion in the deeper portion of the p well 150 is accordingly less than that in the shallower portion of the p well 150. Such arrangement of the p well 150 attains a relatively high level of withstand voltage between electrodes of the low-breakdown-voltage nMOS.

Figure 21:
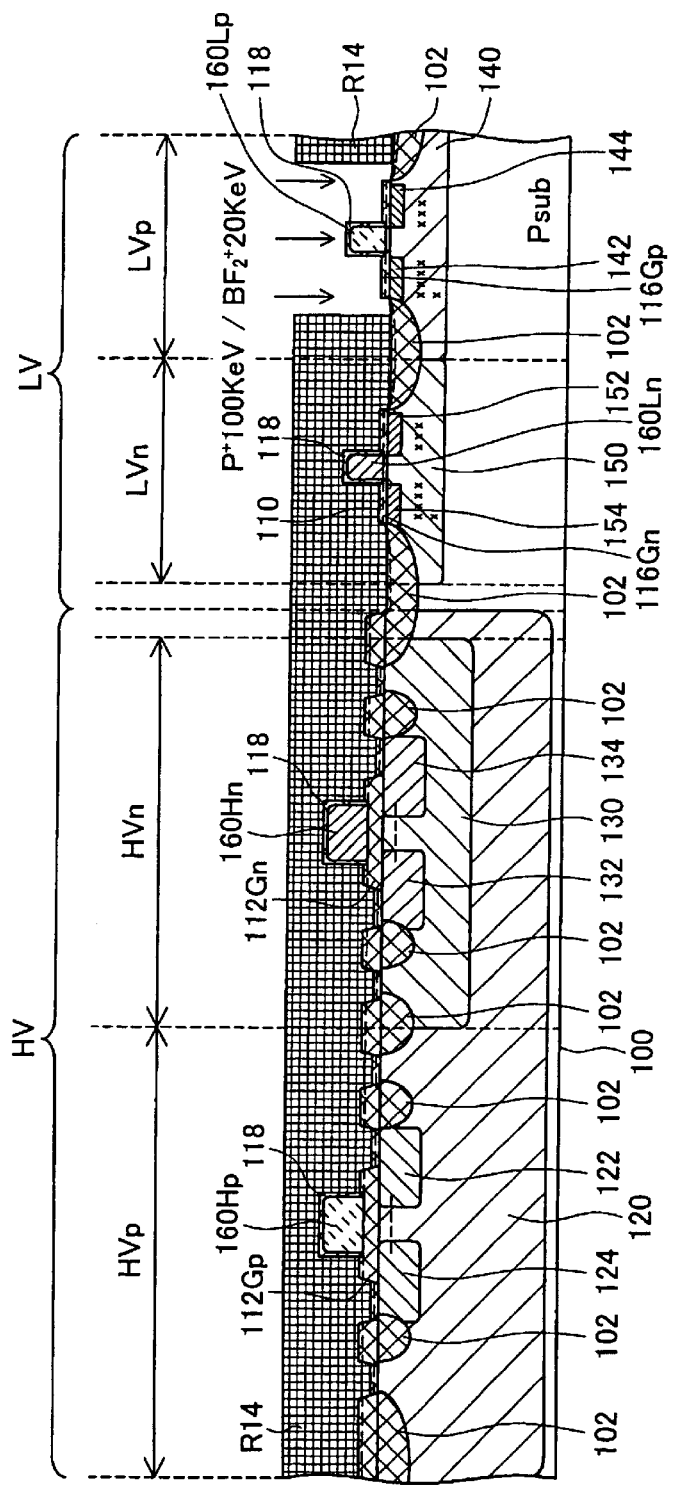
FIG. 21 is a sectional view schematically illustrating a process of forming source and drain offset areas of the low-breakdown-voltage pMOS.

The procedure then forms a source offset area and a drain offset area of the low-breakdown-voltage pMOS on the substrate surface side of the n well 140. FIG. 21 is a sectional view schematically illustrating a process of forming source and drain offset areas of the low-breakdown-voltage pMOS.

As shown in FIG. 21, the procedure forms a fourteenth resist R14 on a remaining area other than the low-breakdown-voltage pMOS area LVp and implants a p-type impurity ion into a shallower portion of the n well 140. In this example, boron fluoride ion ($BF_2^+$) having an energy level of 20 keV is implanted as the p-type impurity ion. This makes a drain offset area 142 and a source offset area 144 for defining a drain area and a source area.

The procedure subsequently implants an n-type impurity ion into a deeper portion of the n well 140. In this example, phosphorus ion ($P^+$) having an energy level of 100 keV is implanted as the n-type impurity ion. The concentration of the p-type impurity ion in the deeper portion of the n well 140 is accordingly less than that in the shallower portion of the n well 140. Such arrangement of the n well 140 attains a relatively high level of withstand voltage between electrodes of the low-breakdown-voltage pMOS.

The process of forming the offset areas of the low-breakdown-voltage nMOS shown in FIG. 20 and the process of forming the offset areas of the low-breakdown-voltage pMOS shown in FIG. 21 may be carried out in the reverse order.

Figure 22:
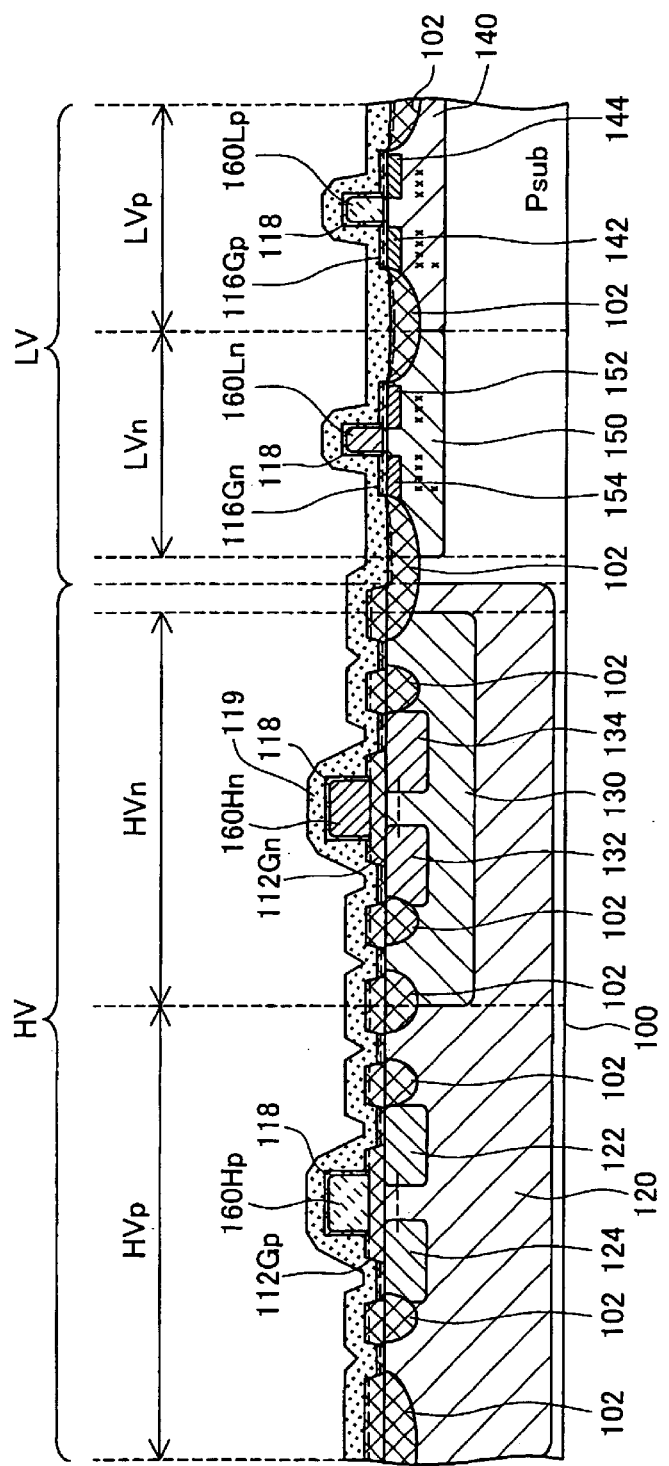
FIG. 22 is a sectional view schematically illustrating a process of forming side walls.
Figure 23:
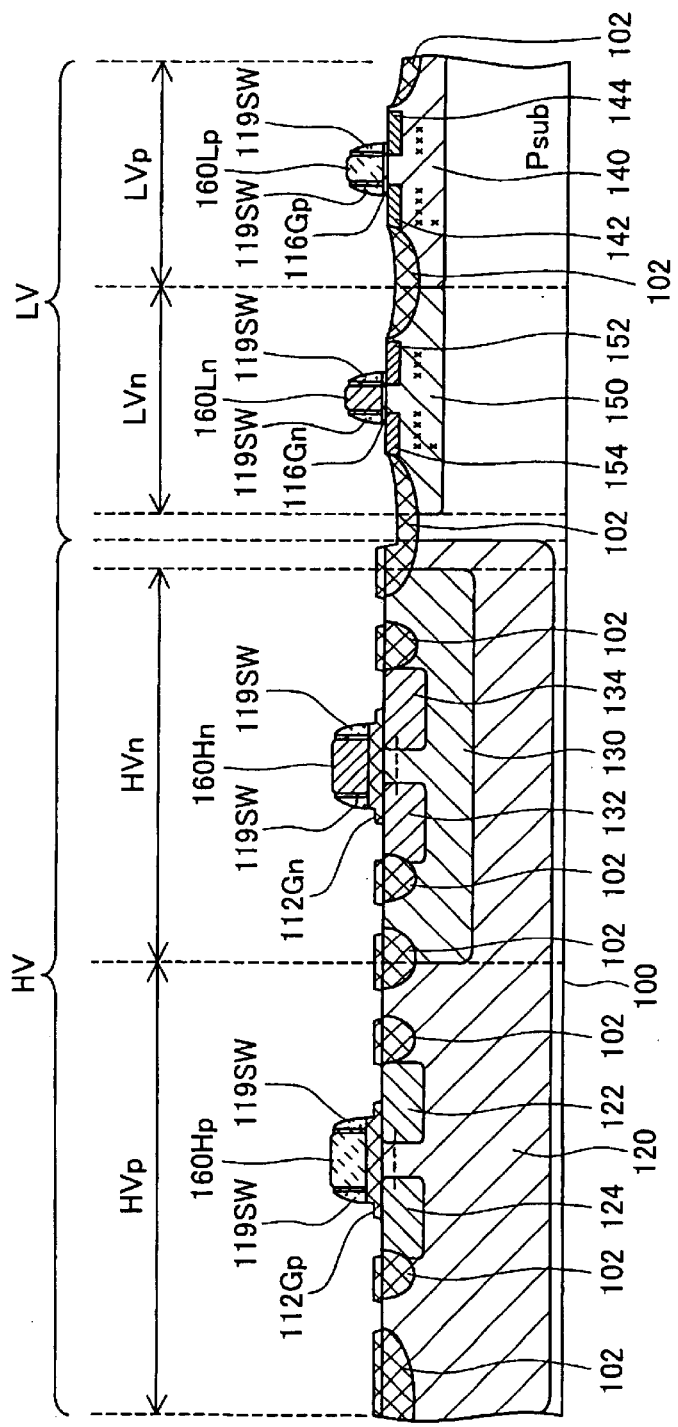
FIG. 23 is a sectional view schematically illustrating the process of forming the side walls.

The procedure subsequently forms side walls on the side faces of the gate electrode 160Ln of the low-breakdown-voltage nMOS and the gate electrode 160Lp of the low-breakdown-voltage pMOS as the mask for formation of the source area and the drain area. FIGS. 22 and 23 are sectional views schematically illustrating a process of forming side walls.

The procedure forms a sixth oxide film 119 for defining side walls over the whole surface of the substrate 100 as shown in FIG. 22. The sixth oxide film 119 in this example has a thickness of approximately 1300 angstrom. The procedure etches back to complete removal of the fifth oxide film 118 and the sixth oxide film 119 covering over the top faces of the gate electrodes 160Hp, 160Hn, 160Lp, and 160Ln of the respective transistors as shown in FIG. 23. Side walls 119SW of the fifth oxide film 118 and the sixth oxide film 119 are accordingly made on the side faces of the gate electrodes 160Lp and 160Ln of the low-breakdown-voltage pMOS and the low-breakdown-voltage nMOS. In a similar manner, the side walls 119SW are also made on the side faces of the gate electrodes 160Hn and 160Hp of the high-breakdown-voltage nMOS and the high-breakdown-voltage pMOS.

Figure 24:
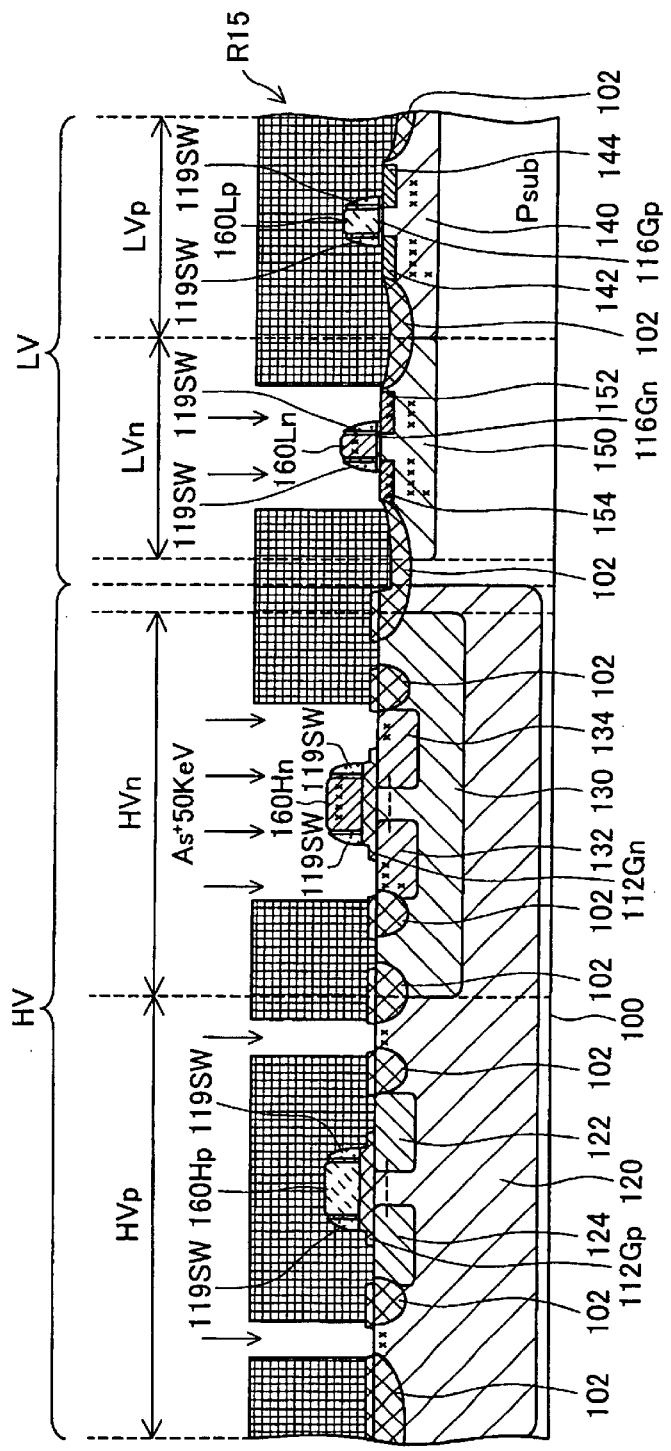
FIG. 24 is a sectional view schematically illustrating a process of specifying drain areas and source areas of the high-breakdown-voltage transistor and the low-breakdown-voltage transistor.
Figure 25:
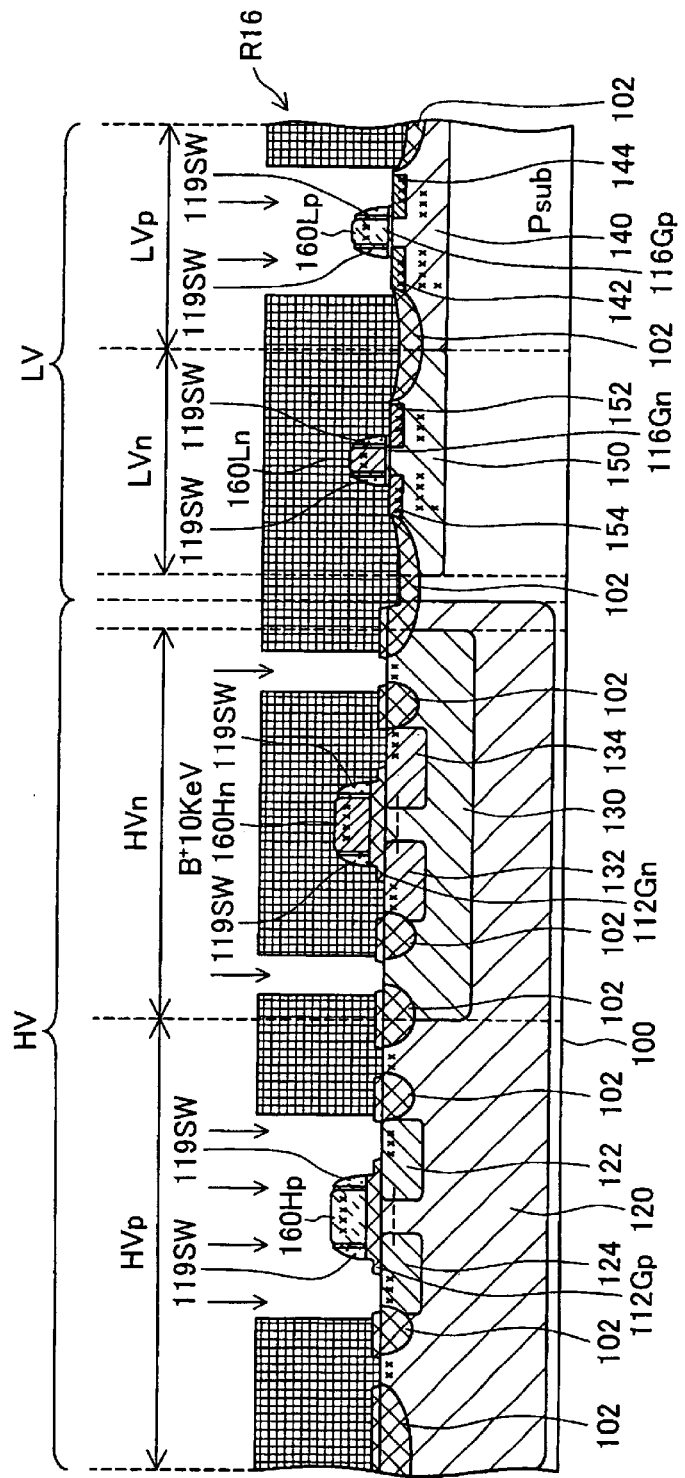
FIG. 25 is a sectional view schematically illustrating the process of specifying the drain areas and the source areas of the high-breakdown-voltage transistor and the low-breakdown-voltage transistor.
Figure 26:
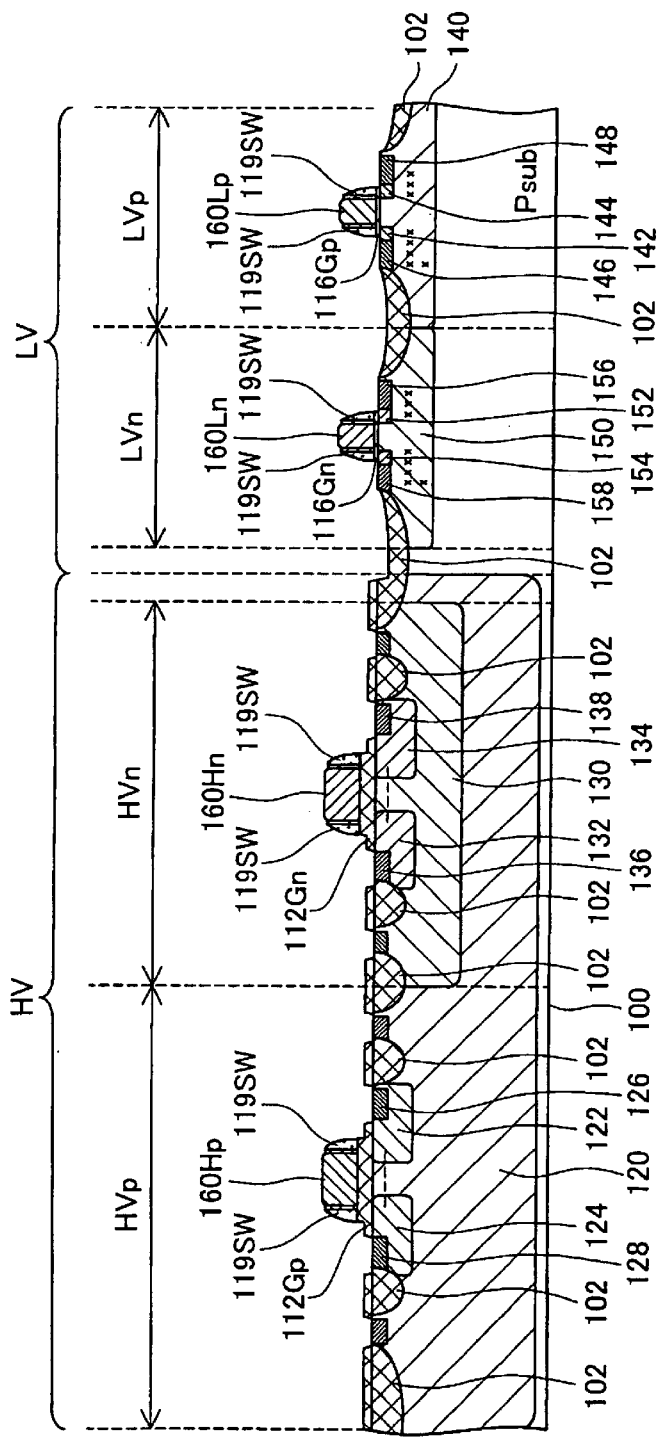
FIG. 26 is a sectional view schematically illustrating the process of specifying the drain areas and the source areas of the high-breakdown-voltage transistor and the low-breakdown-voltage transistor.

The procedure subsequently forms source areas and drain areas of the high-breakdown-voltage transistor and the low-breakdown-voltage transistor. FIGS. 24 through 26 are sectional views schematically illustrating a process of specifying source areas and drain areas of the high-breakdown-voltage transistor and the low-breakdown-voltage transistor.

The procedure first forms a fifteenth resist R15 on a remaining area other than the element forming regions of the high-breakdown-voltage nMOS area HVn and the low-breakdown-voltage nMOS area LVn as shown in FIG. 24. The procedure then implants an n-type impurity ion with the fifteenth resist R15 and the gate oxide film 112Gn in the element forming region of the high-breakdown-voltage nMOS area HVn as the mask or with the fifteenth resist R15, the gate electrode 160Ln, and the side walls 119SW in the element forming region of the low-breakdown-voltage nMOS area LVn as the mask. In this example, arsenic ion ($As^+$) having an energy level of 50 keV is implanted.

The procedure forms a sixteenth resist R16 on a remaining area other than the element forming regions of the high-breakdown-voltage pMOS area HVp and the low-breakdown-voltage pMOS area LVp as shown in FIG. 25. The procedure then implants a p-type impurity ion with the sixteenth resist R16 and the gate oxide film 112Gp in the element forming region of the high-breakdown-voltage pMOS area HVp as the mask or with the sixteenth resist R16, the gate electrode 160Lp, and the side walls 119SW in the element forming region of the low-breakdown-voltage pMOS area LVp as the mask. In this example, boron ion ($B^+$) having an energy level of 10 keV is implanted.

The ion implantation process shown in FIG. 24 and the ion implantation process shown in FIG. 25 may be carried out in the reverse order.

High-temperature heat treatment is carried out for a long time period to diffuse the implanted impurity ions and thereby form a drain area 126 and a source area 128 of the high-breakdown-voltage pMOS, a drain area 136 and a source area 138 of the high-breakdown-voltage nMOS, a drain area 146 and a source area 148 of the low-breakdown-voltage pMOS, and a drain area 156 and a source area 158 of the low-breakdown-voltage nMOS as shown in FIG. 26.

The n-type impurity ion is implanted into the gate electrodes 160Hn and 160Ln of the nMOS, whereas the p-type impurity ion is implanted into the gate electrodes 160Hp and 160Lp of the pMOS as shown in FIGS. 24 and 25. This lowers the resistances of the respective gate electrodes 160Hn, 160Ln, 160Hp, and 160Lp.

The impurity ions are also implanted into specific areas interposed between the LOCOS film-parts 102 other than the nMOS- and pMOS-forming regions in the high-breakdown-voltage transistor area HV as shown in FIGS. 24 and 25. Such implantation prevents insufficient isolation of the elements, due to parasitic generation of channels in the specific areas interposed between the LOCOS film-parts 102.

Figure 27:
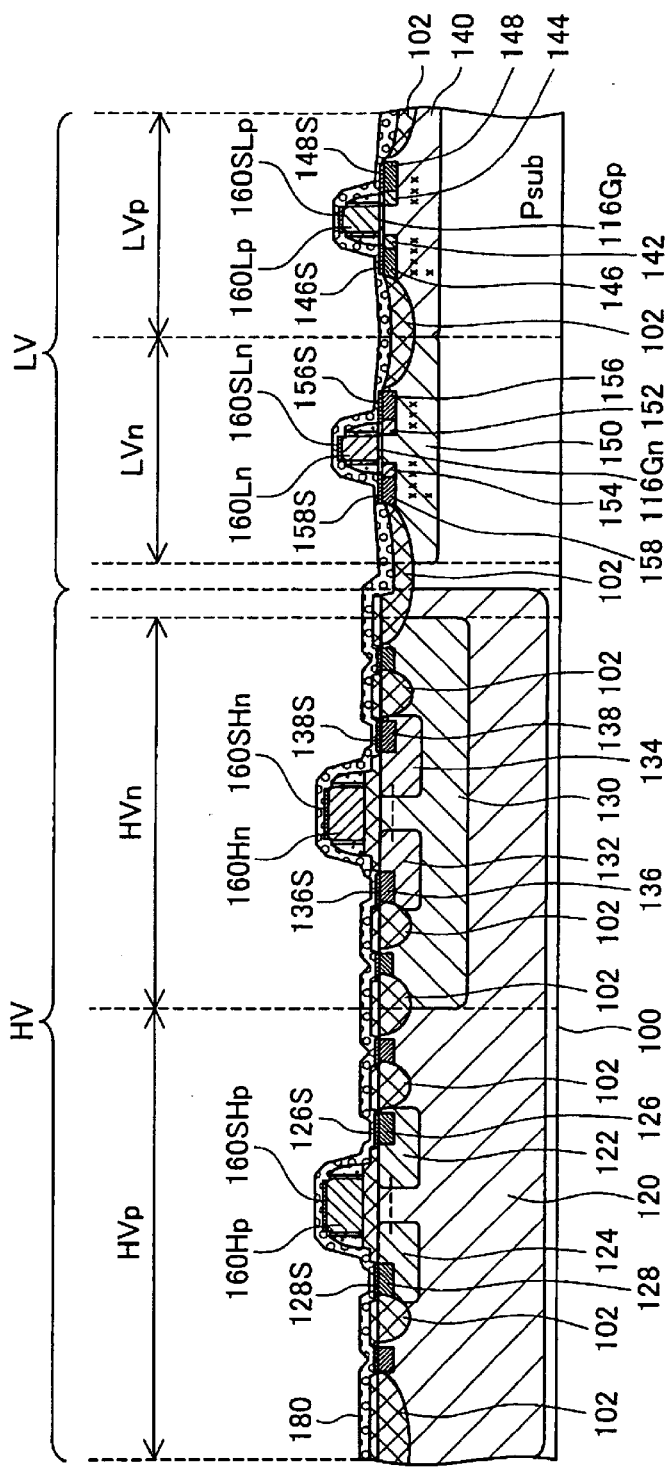
FIG. 27 is a sectional view schematically illustrating a silicidation process.
Figure 28:
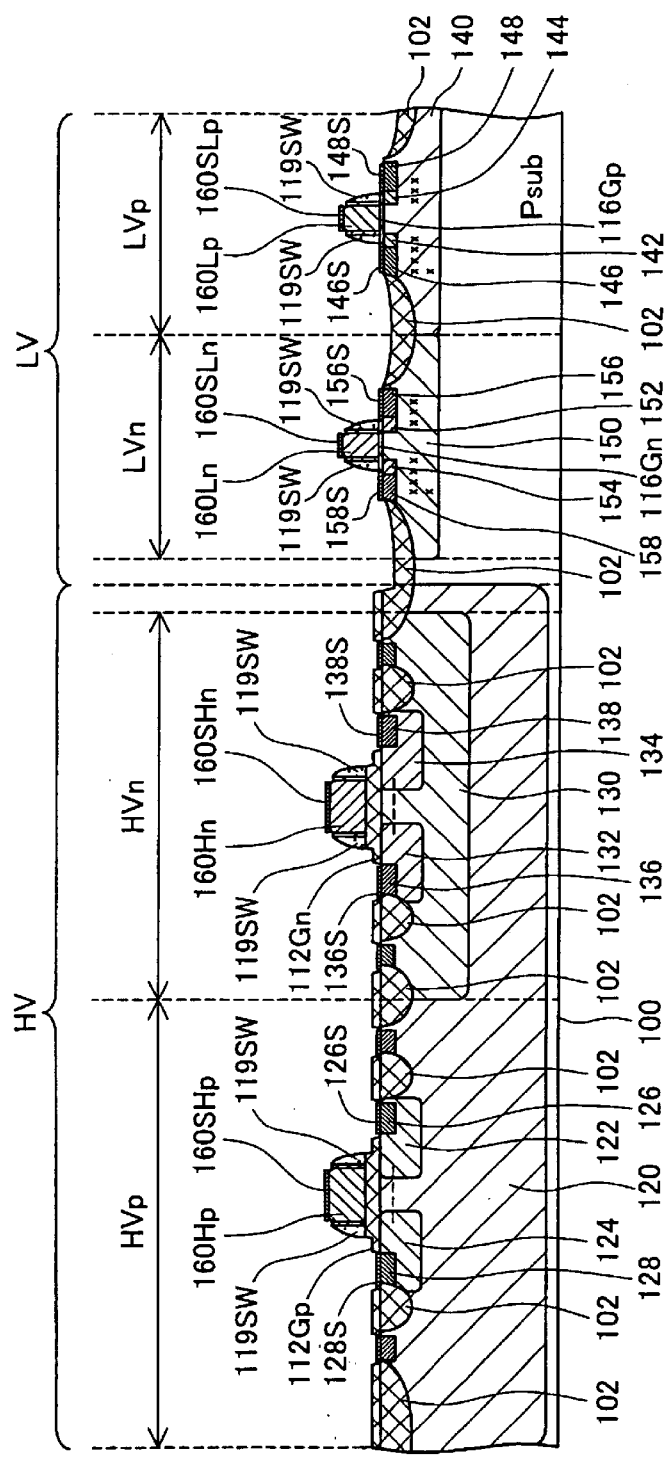
FIG. 28 is a sectional view schematically illustrating the silicidation process.

The procedure subsequently silicidates the surface of the drain, gate, and source areas of the respective transistors. FIGS. 27 and 28 are sectional views schematically illustrating a silicidation process.

A titanium (Ti) film 180 is formed over the whole surface of the substrate 100 by sputtering as shown in FIG. 27. High-temperature heat treatment is carried out for a long time period for silicidation of contact areas 160SHp, 160SHn, 160SLp, 160SLn, 126S, 136S, 146S, 156S, 128S, 138S, 148S, and 158S of the gates 160Hp, 160Hn, 160Lp, and 160Ln, the drains 126, 136, 146, and 156, and the sources 128, 138, 148, and 158 of the respective transistors, which are in contact with the titanium film 180. The non-silicidated titanium film 180 is removed in a self-aligning manner as shown in FIG. 28.

A required series of processes (not shown) including a wiring process are performed after the respective processes shown in FIGS. 1 through 28. This procedure efficiently manufactures a semiconductor device, in which both the high-breakdown-voltage transistor and the low-breakdown-voltage transistor are formed on the identical substrate 100.

Figure 29A:
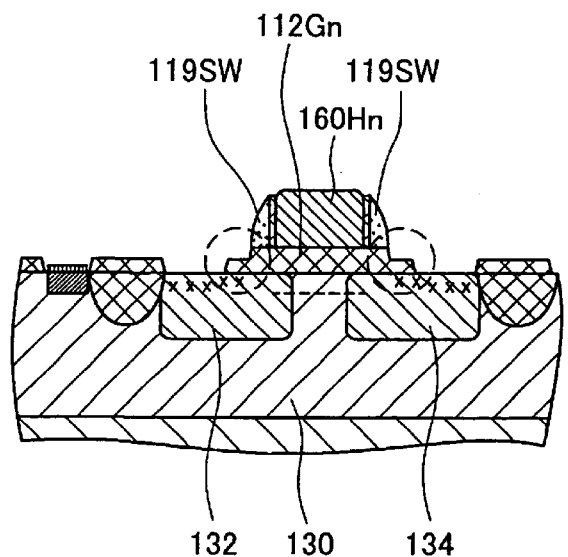
FIGS. 29(A) and 29(B) are sectional views schematically illustrating the structural features of the high-breakdown-voltage nMOS manufactured according to the basic manufacturing method.
Figure 29B:
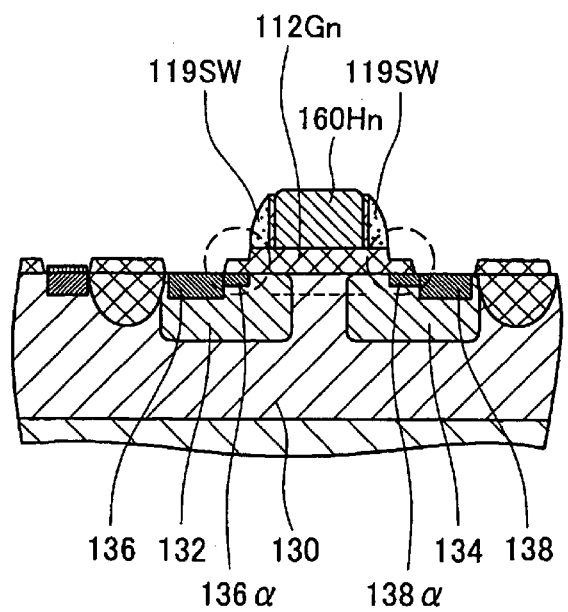
Figure 30:
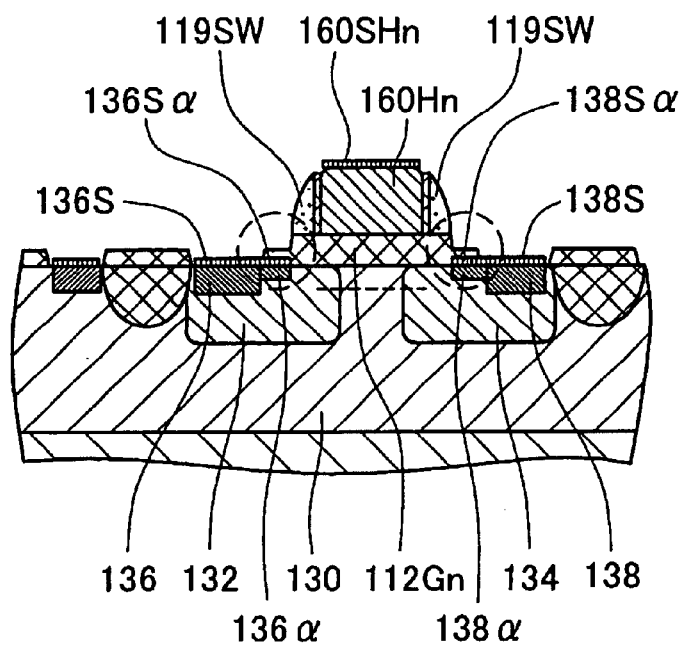
FIG. 30 is a sectional view schematically illustrating the structural features of the high-breakdown-voltage nMOS manufactured according to the basic manufacturing method.

B. Structural Problems of High-breakdown-voltage Transistor Manufactured According to Basic Manufacturing Method FIGS. 29(A), 29(B), and 30 are sectional views schematically illustrating structural features of the high-breakdown-voltage nMOS manufactured according to the basic manufacturing method described above. The structural features of the high-breakdown-voltage pMOS are similar to those of the high-breakdown-voltage nMOS. The following thus describes only the structural features of the high-breakdown-voltage nMOS.

A gate oxide film 112Gn of the high-breakdown-voltage nMOS is over-etched in the process of formation of the side walls 119SW shown in FIGS. 22 and 23. A peripheral portion (a portion encircled by the broken line) of the gate oxide film 112Gn without the side fall 119SW accordingly has the less thickness than the thickness of its center portion as shown in FIG. 29(A). The impurity ion is thus implanted into unexpected areas that are masked with the gate oxide film 112Gn to prohibit implantation of the impurity ion, that is, under-layer offset areas below the peripheral portion (the portion encircled by the broken line) of the gate oxide film 112Gn as shown in FIG. 29(A), in the process of implanting the impurity ion into the offset areas 132 and 134 shown in FIGS. 24 and 25. The heat treatment process shown in FIG. 26 diffuses the implanted impurity ion, so that an additional drain area 136α and an additional source area 138α are formed below the peripheral portion (the portion encircled by the broken line) of the gate oxide film 112Gn as shown in FIG. 29(B). Such formation of the additional drain area 136α and the additional source area 138α narrows the distance between the drain area and the source area and may accordingly lower the level of withstand voltage between the electrodes.

In the silicidation process of FIG. 27, surface regions 136Sα and 138Sα of the under-layer offset areas 136α and 138α below the peripheral portion (the portion encircled by the broken line) of the gate oxide film 112Gn may be silicidated as shown in FIG. 30. Such silicidation also narrows the distance between the drain area and the source area and may accordingly lower the level of withstand voltage between the electrodes. The peripheral portion (the portion encircled by the broken line) of the gate oxide film 112Gn has the less thickness than the thickness of its center portion. The silicidation may thus occur in the thinner peripheral portion even when the under-layer offset areas 136α and 138α below the peripheral portion of the gate oxide film 112Gn are protected from implantation of the impurity and neither additional drain area nor additional source area is formed.

As described above, the gate oxide film of the high-breakdown-voltage transistor manufactured according to the basic manufacturing method is over-etched in the process of forming the side walls on the gate electrode of the low-breakdown-voltage transistor. Such over-etching may lower the level of withstand voltage between the electrodes.

C. Manufacturing Method of First Embodiment

In order to solve the drawback of the high-breakdown-voltage transistor manufactured by the basic manufacturing method, a first embodiment of the present invention modifies part of the basic manufacturing method as shown in FIGS. 31 through 38. FIGS. 31 through 38 are sectional views schematically illustrating main processes in a method of manufacturing a semiconductor device as the first embodiment of the present invention.

Figure 31:
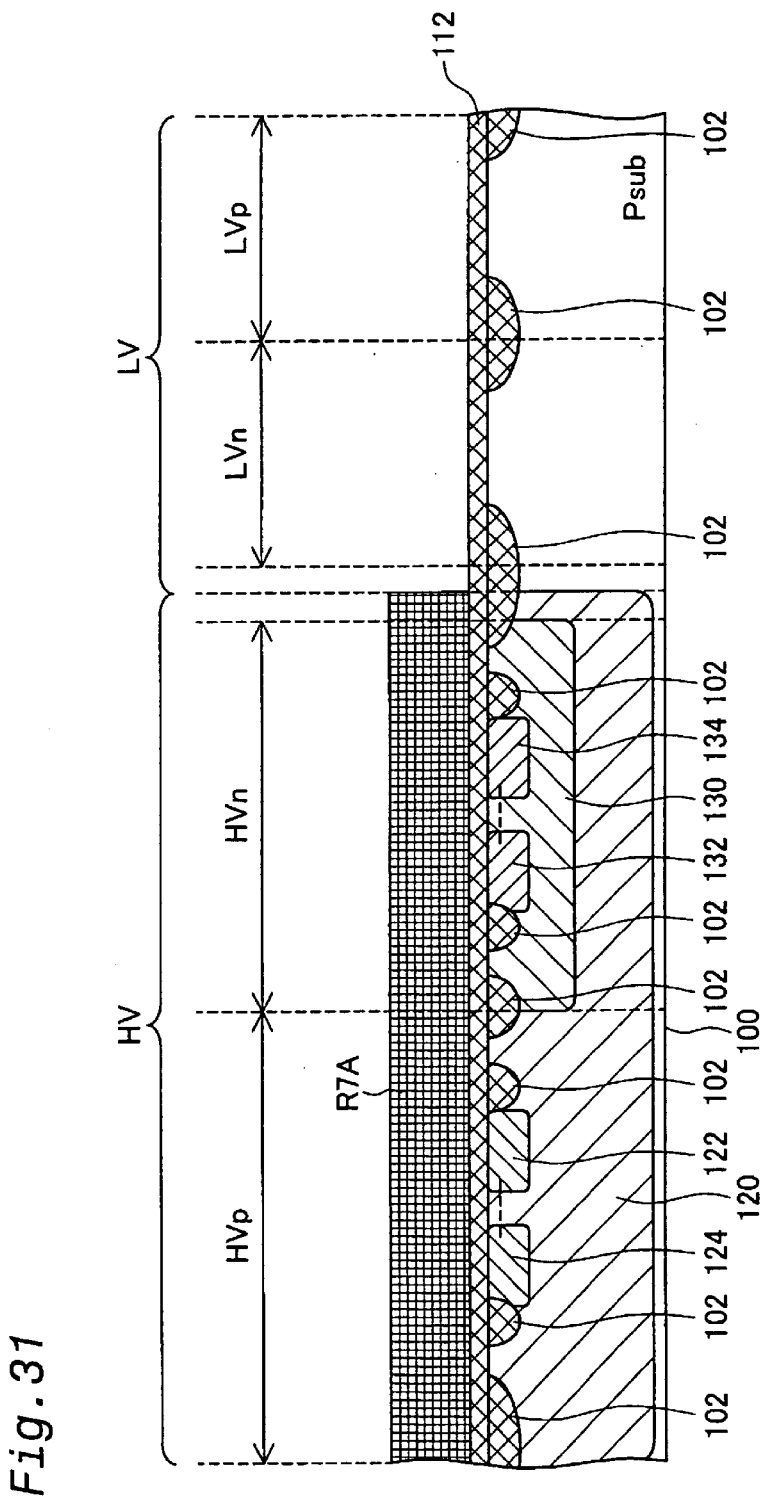
FIG. 31 is a sectional view schematically illustrating a process of forming an oxide film, which is expected to function as a gate oxide film of a high-breakdown-voltage transistor, in a manufacturing method of a semiconductor device in a first embodiment of the present invention.
Figure 32:
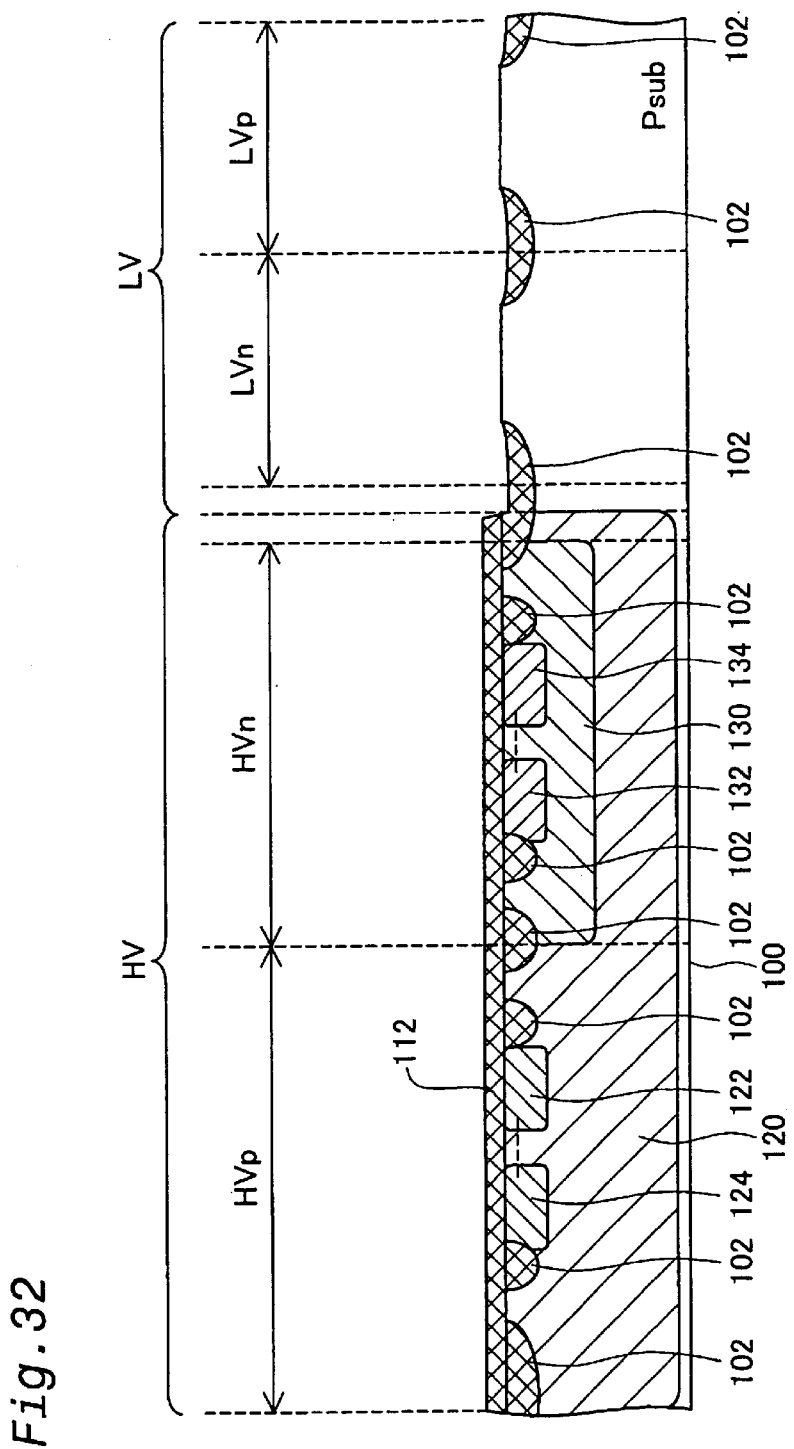
FIG. 32 is a sectional view schematically illustrating the process of forming the oxide film, which is expected to function as the gate oxide film of the high-breakdown-voltage transistor, in the manufacturing method of the first embodiment.

The manufacturing method of this embodiment changes the process of forming the gate oxide film of the high-breakdown-voltage transistor in the basic manufacturing method shown in FIGS. 11 and 12 into a process of FIGS. 31 and 32.

FIGS. 31 and 32 are sectional views schematically illustrating a process of forming an oxide film, which is expected to function as a gate oxide film of the high-breakdown-voltage transistor, in the manufacturing method of the embodiment. As clearly understood from comparison between the process of FIGS. 31 and 32 and the process of FIGS. 11 and 12, with regard to the second oxide film 112 formed on the substrate 100, the oxide film in the low-breakdown-voltage transistor area LV is all removed, while the whole oxide film in the high-breakdown-voltage transistor area HV is left intact without any opening. The resist R7 is thus changed to a resist R7A in the process of FIG. 31.

Referring to FIG. 31, after formation of the second oxide film 112 by thermal oxidation, the concrete procedure forms the resist R7A over the whole high-breakdown-voltage transistor area HV in order to protect the second oxide film 112 in the high-breakdown-voltage transistor area HV and etches off only the oxide film 112 in the low-breakdown-voltage transistor area LV. The oxide film, which is expected to function as a gate oxide film, is accordingly formed only in the high-breakdown-voltage transistor area HV as shown in FIG. 32.

The subsequent processes of the manufacturing method in this embodiment up to the process of forming the source and drain offset areas of the low-breakdown-voltage MOS shown in FIGS. 20 and 21 are similar to those in the basic manufacturing method discussed above. In the method of this embodiment, however, the whole surface of the oxide film is left intact in the high-breakdown-voltage transistor area HV. According to such difference, for example, the shape of the tenth resist R10 formed in the high-breakdown-voltage transistor area HV is changed in the process of forming the gate oxide film of the low-breakdown-voltage transistor shown in FIG. 15.

Figure 33:
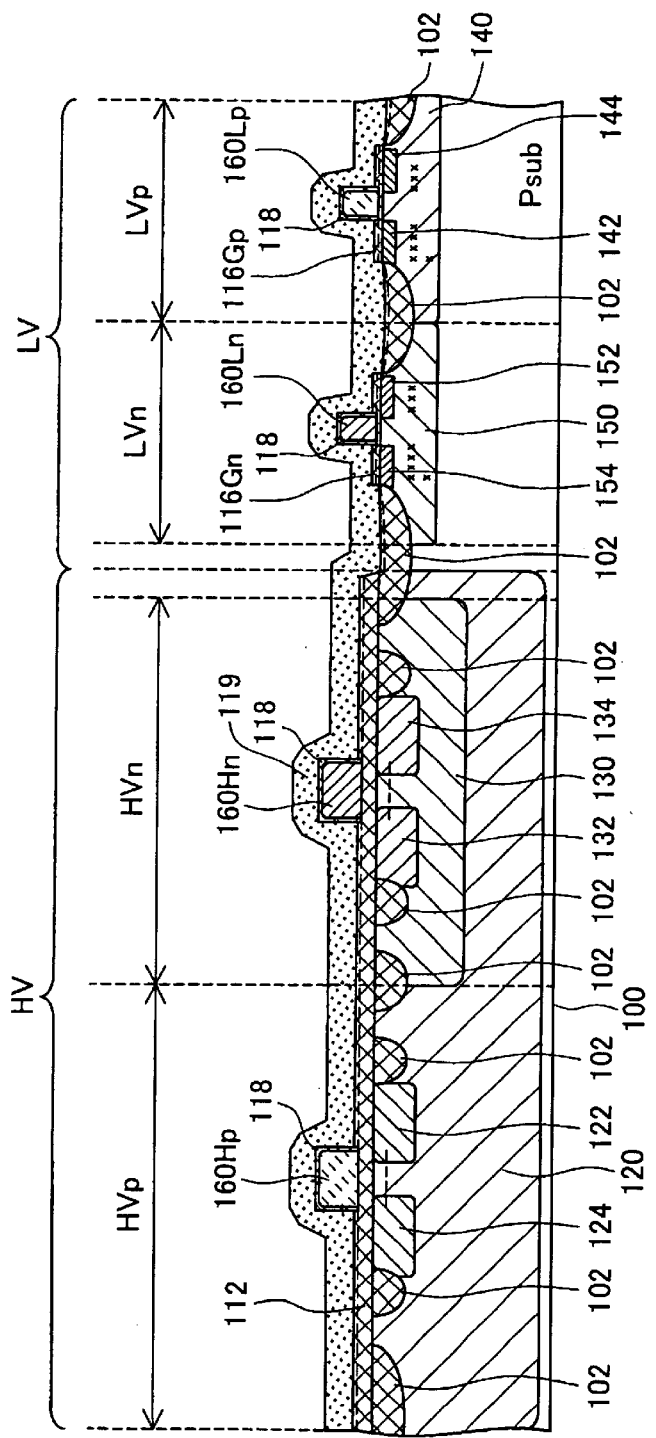
FIG. 33 is a sectional view schematically illustrating a process of forming side walls in the manufacturing method of the first embodiment.
Figure 34:
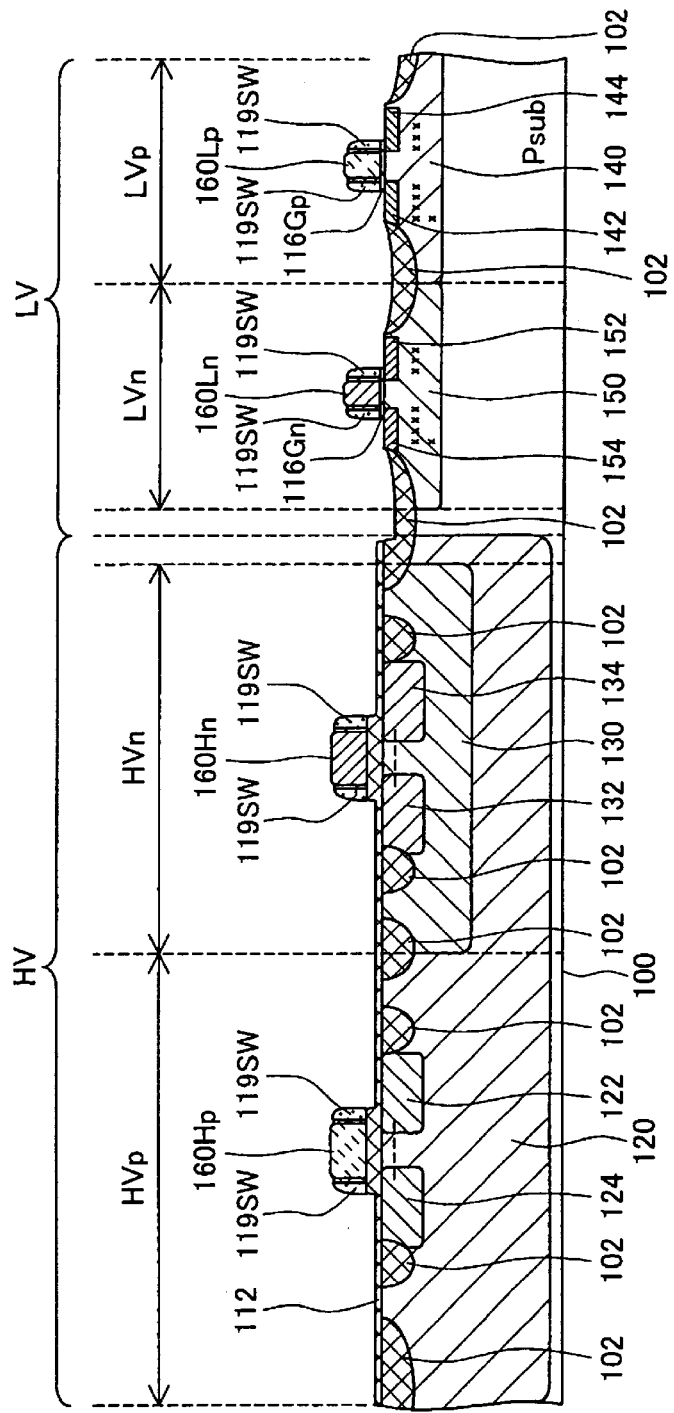
FIG. 34 is a sectional view schematically illustrating the process of forming the side walls in the manufacturing method of the first embodiment.
Figure 35:
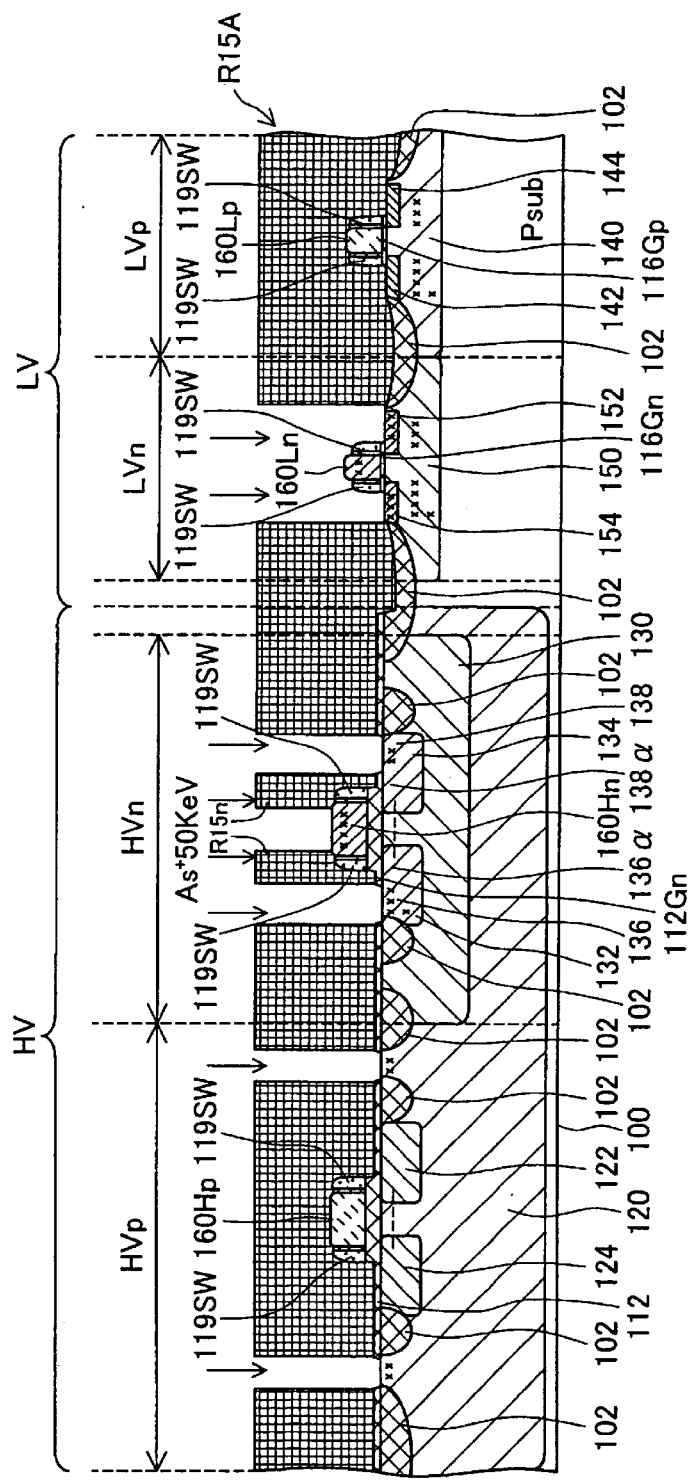
FIG. 35 is a sectional view schematically illustrating a process of specifying drain areas and source areas of a high-breakdown-voltage transistor and a low-breakdown-voltage transistor in the manufacturing method of the first embodiment.
Figure 36:
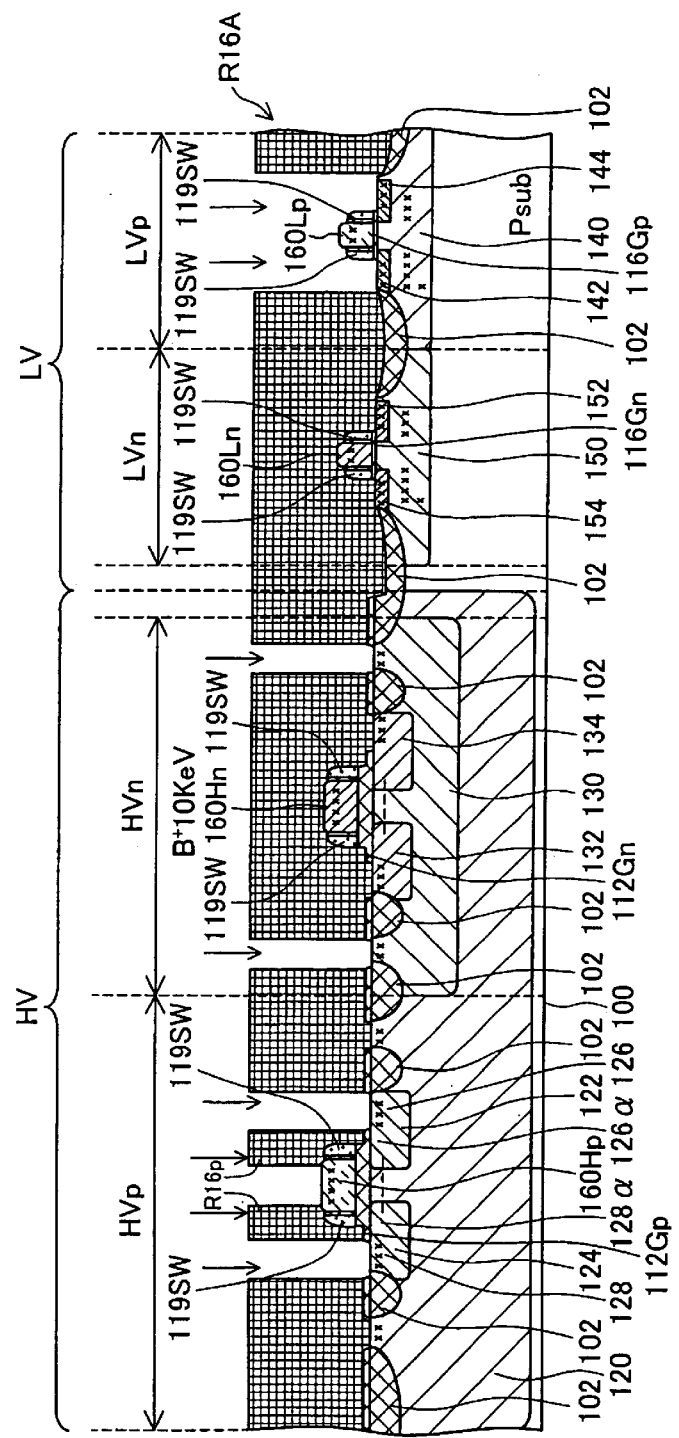
FIG. 36 is a sectional view schematically illustrating the process of specifying the drain areas and the source areas of the high-breakdown-voltage transistor and the low-breakdown-voltage transistor in the manufacturing method of the first embodiment.

The manufacturing method of this embodiment changes the process of forming the side walls shown in FIGS. 22 and 23 and the process of specifying the drain areas and the source areas of the high-breakdown-voltage transistor and the low-breakdown-voltage transistor shown in FIGS. 24 and 25 in the basic manufacturing method into a process of FIGS. 33 and 34 and a process of FIGS. 35 and 36, respectively.

FIGS. 33 and 34 are sectional views schematically illustrating a process of forming side walls in the manufacturing method of the embodiment. In the process of FIG. 24 in the basic manufacturing method, the sixth oxide film 119 for defining the side walls has a standard thickness of approximately 1300 angstrom. In the process of this embodiment shown in FIG. 33, on the other hand, the sixth oxide film 119 has a greater thickness of approximately 2000 angstrom.

Referring to FIG. 33, the concrete procedure forms a sixth oxide film 119 for defining side walls over the whole surface of the substrate 100 in a thickness of approximately 2000 angstrom, which is greater than the standard thickness (approximately 1300 angstrom). The sixth oxide film 119 is then over-etched in the low-breakdown-voltage transistor area LV to exposure of the substrate 100 as shown in FIG. 34. Side walls 119SW of the fifth oxide film 118 and the sixth oxide film 119 are accordingly formed on the side faces of the gate electrode 160Lp of the low-breakdown-voltage pMOS and the gate electrode 160Ln of the low-breakdown-voltage nMOS. The side walls 119SW are also formed on the side faces of the gate electrode 160Hn of the high-breakdown-voltage nMOS and the gate electrode 160Hp of the high-breakdown-voltage pMOS.

The amount of etching an oxide film is generally proportional to the thickness of the oxide film. The greater thickness of the sixth oxide film 119 for defining the side walls than the standard thickness (approximately 1300 angstrom) thus requires the greater amount of etching. As clearly understood from the comparison between FIG. 34 and FIG. 23, the thickness of the remaining oxide film (the second oxide film 112) in the high-breakdown-voltage transistor area HV after etching in the manufacturing method of this embodiment is accordingly made thinner than the thickness of the remaining oxide film in the basic manufacturing method.

FIGS. 35 and 36 are sectional views schematically illustrating a process of specifying drain areas and source areas of the high-breakdown-voltage transistor and the low-breakdown-voltage transistor in the manufacturing method of the embodiment. As clearly understood from the comparison with the process of FIG. 24, the fifteenth resist R15 is changed to a resist R15A in the process of FIG. 35. The resist R15A includes a resist R15n, which covers at least the side wall 119SW and the peripheral oxide film 112 in the high-breakdown-voltage nMOS area HVn. The procedure of FIG. 35 uses this resist R15A and etches off non-required portions of the oxide film 112. This makes drain-source forming regions, which are expected to form a drain area and a source area, open in the element forming region of the high-breakdown-voltage nMOS area HVn. The procedure does not remove the resist R15A but continuously uses the same resist R15A, and implants the n-type impurity ion into the open drain-source forming regions.

Referring to FIG. 35, the concrete procedure forms the resist R15A over the whole area other than the element forming regions of the high-breakdown-voltage nMOS area HVn and the low-breakdown-voltage nMOS area LVn, and etches off non-required portions of the oxide film 112 in the high-breakdown-voltage transistor area HV with the resist R15A. This makes the drain-source forming regions open in the element forming region of the high-breakdown-voltage nMOS area HVn, and separates a gate oxide film 112Gn. The procedure subsequently carries out implantation of the n-type impurity ion with the resist R15A as the mask and the gate electrode 160Ln and the side wall 119SW as the mask in the element forming region of the low-breakdown-voltage nMOS area LVn. In this embodiment, arsenic ion (As$^+$) having an energy level of 50 keV is implanted.

As clearly understood from the comparison with the process of FIG. 25, the sixteenth resist R16 is changed to a resist R16A in the process of FIG. 36. The resist R16A includes a resist R16p, which covers at least the side wall 119SW and the peripheral oxide film 112 in the high-breakdown-voltage pMOS area HVp. The procedure of FIG. 36 uses this resist R16A and etches off non-required portions of the oxide film 112. This makes the drain-source forming regions open in the element forming region of the high-breakdown-voltage pMOS area HVp. The procedure does not remove the resist R16A but continuously uses the same resist R16A, and implants the p-type impurity ion into the open drain-source forming regions.

Referring to FIG. 36, the concrete procedure forms the resist R16A over the whole area other than the element forming regions of the high-breakdown-voltage pMOS area HVp and the low-breakdown-voltage pMOS area LVp, and etches off non-required portions of the oxide film 112 in the high-breakdown-voltage transistor area HV with the resist R16A. This makes the drain-source forming regions open in the element forming region of the high-breakdown-voltage pMOS area HVp, and separates a gate oxide film 112Gp. The procedure subsequently carries out implantation of the p-type impurity ion with the resist R16A as the mask and the gate electrode 160Lp and the side wall 119SW as the mask in the element forming region of the low-breakdown-voltage pMOS area LVp. In this embodiment, boron ion (B$^+$) having an energy level of 10 keV is implanted.

In the implantation process of the n-type impurity ion shown in FIG. 35, the resist R15n of the resist R15A functions as the mask and effectively prevents the n-type impurity ion from being implanted into the under-layer offset areas 136α and 138α (see FIG. 29) in the thinner portions of the gate oxide film 112Gn. In a similar manner, in the implantation process of the p-type impurity ion shown in FIG. 36, the resist R16p of the resist R16A functions as the mask and effectively prevents the p-type impurity ion from being implanted into the under-layer offset areas 126α and 128α (see FIG. 29) in the thinner portions of the gate oxide film 112Gp.

The procedure of the embodiment uses the resists R15A and R16A and makes the drain-source forming regions open in the element forming regions of the high-breakdown-voltage MOS areas in the process of FIGS. 35 and 36. The procedure does not remove the resists R15A and R16A but uses the same resists R15A and R16A and carries out implantation of the impurity ions into the open drain-source forming regions. This arrangement ensures accurate implantation of the impurity ions into the target regions.

The basic manufacturing method discussed above uses the new resists R15 and R16 and implants the impurity ions into the drain-source forming regions in the process of FIGS. 25 and 26, which is several steps after the process of making the drain-source forming regions open in the high-breakdown-voltage transistor area HV shown in FIGS. 11 and 12. There is accordingly a possibility of positional shift between the openings of the resists R15 and R16 and the drain-source forming regions. It is accordingly difficult to accurately implant the impurity ions into the drain-source forming regions. The manufacturing method of the embodiment, on the other hand, does not remove the resists R15A and R16A, which are used in the process of opening the drain-source forming regions, but continuously uses the same resists R15A and R16A in the process of implantation of the impurity ions into the drain-source forming regions. There is accordingly no possibility of positional shift. The method of the embodiment thus ensures accurate implantation of the impurity ions into the target regions.

In the course of opening the drain-source forming regions in the element forming regions of the high-breakdown-voltage MOS area by etching with the resists R15A and R16A, the element forming region of the low-breakdown-voltage nMOS area LVn is not covered with the resist R15A in the process of FIG. 35. The element forming region of the low-breakdown-voltage pMOS area LVp is not covered with the resist R16A in the process of FIG. 36. These element forming regions are open for subsequent ion implantation. The side walls 119SW of the oxide film are accordingly affected by etching in these element forming regions of the low-breakdown-voltage MOS area. In the manufacturing method of the embodiment, however, as discussed previously, the side walls 119SW are made of the oxide film 119 having the greater thickness (approximately 2000 angstrom) than the standard thickness in the process of FIGS. 33 and 34. Even if part of the side walls 119SW is etched off in the process of FIGS. 35 and 36, this arrangement ensures a desired resulting film thickness required for the side walls 119SW. As described above, the thick oxide film 119 for defining the side walls allows reduction of the thickness of the remaining oxide film 112 in the high-breakdown-voltage transistor area HV after etching in the process of FIG. 34. This arrangement decreases the amount of etching off the oxide film 112 in the high-breakdown-voltage transistor area HV to open the drain-source forming regions in the process of FIGS. 35 and 36. This accordingly reduces the amount of etching the side walls 119SW in the low-breakdown-voltage transistor area LV in the process of FIGS. 35 and 36.

In the process of FIGS. 35 and 36, the n-type impurity ion is implanted into the gate electrodes 160Hn and 160Ln of the nMOS, whereas the p-type impurity ion is implanted into the gate electrodes 160Hp and 160Lp of the pMOS. This arrangement desirably lowers the resistance of the respective gate electrodes 160Hn, 160Ln, 160Hp, and 160Lp.

In the process of FIGS. 35 and 36, the procedure of the embodiment also opens specific areas interposed between the LOCOS film-parts 102 other than the nMOS- and pMOS-forming regions in the high-breakdown-voltage transistor area HV by etching off the oxide film 112 with the resists R15A and R16A and implants the impurity ions into these areas with the same resists R15A and R16A. The arrangement of the embodiment thus ensures accurate implantation of the impurity ions into these areas interposed between the LOCOS film-parts 102 and desirably prevents insufficient isolation of the elements.

In the process of FIGS. 35 and 36, the resists R15*n* and R16*p* are designed to cover the peripheral ends of the respective electrodes 160Hn and 160Hp by taking into account the accuracy of its dimensions.

Figure 37:
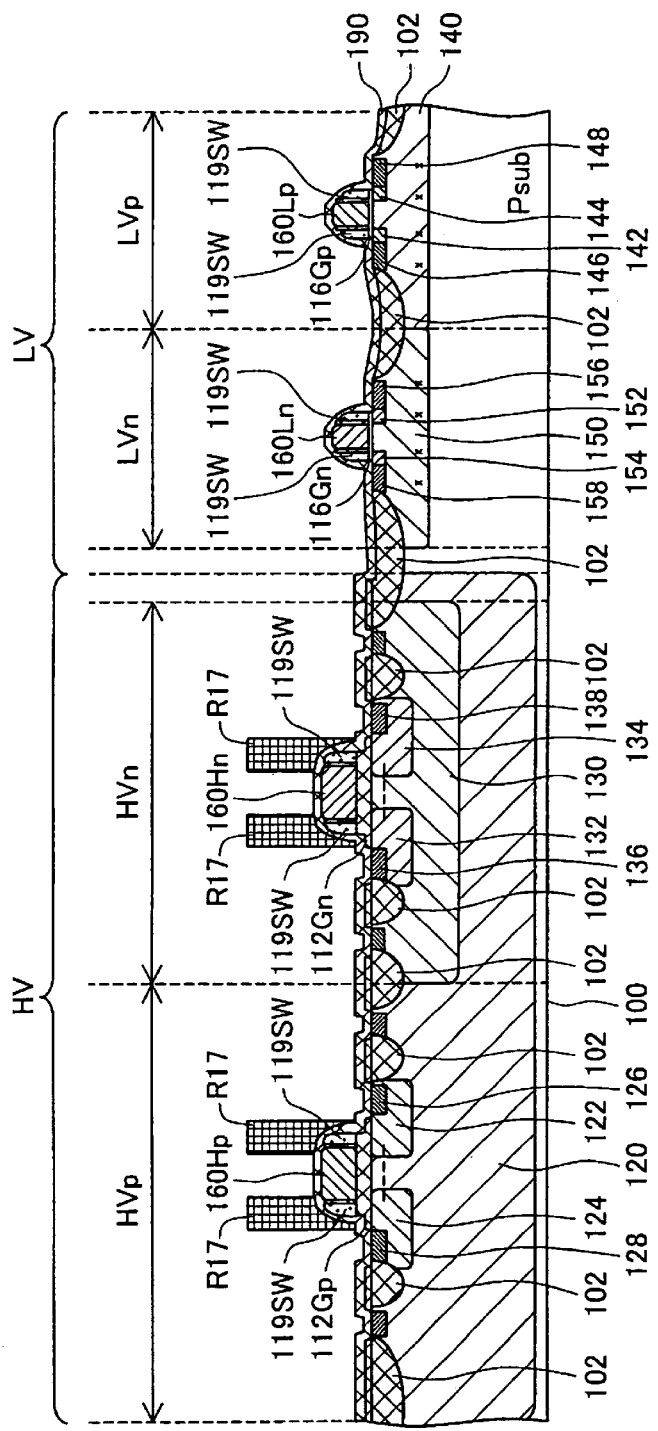
FIG. 37 is a sectional view schematically illustrating a process of forming a protective oxide film for protecting a gate oxide film 112Gn and side walls 119SW of a high-breakdown-voltage nMOS and a gate oxide film 112Gp and side walls 119SW of a high-breakdown-voltage pMOS, in the manufacturing method of the first embodiment.
Figure 38:
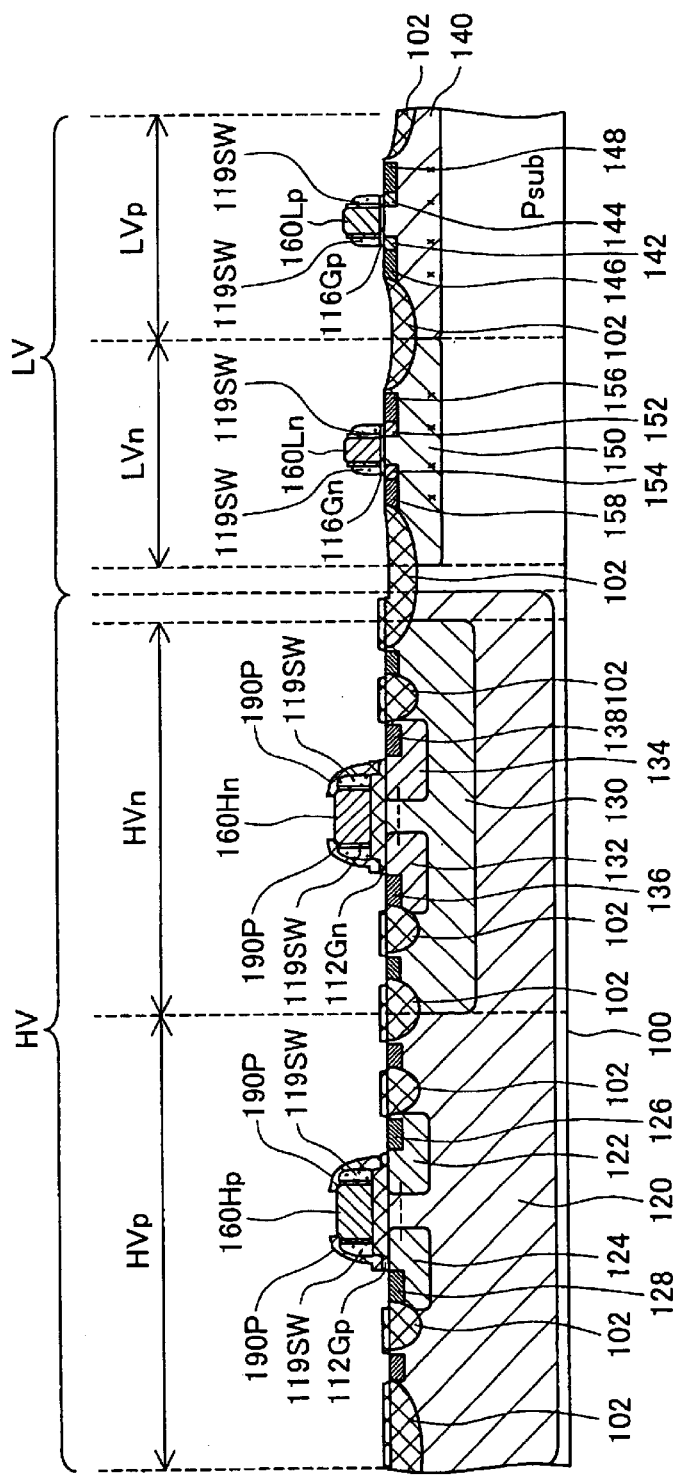
FIG. 38 is a sectional view schematically illustrating the process of forming the protective oxide film for protecting the gate oxide film 112Gn and the side walls 119SW of the high-breakdown-voltage nMOS and the gate oxide film 112Gp and the side walls 119SW of the high-breakdown-voltage pMOS, in the manufacturing method of the first embodiment.

The manufacturing method of the embodiment additionally has a process of FIGS. 37 and 38 before the silicidation process of FIGS. 27 and 28 in the basic manufacturing method. The ion implantation process shown in FIG. 35 and the ion implantation process shown in FIG. 36 may be carried out in the reverse order.

FIGS. 37 and 38 are sectional views schematically illustrating a process of forming a protective oxide film for protecting the gate oxide film 112Gn and the side wall 119SW of the high-breakdown-voltage nMOS and the gate oxide film 112Gp and the side wall 119SW of the high-breakdown-voltage pMOS in the manufacturing method of the embodiment.

The procedure makes a seventh oxide film 190 deposit over the whole surface of the substrate 100 as shown in FIG. 37. In this embodiment, the seventh oxide film 190 is made to deposit in a thickness of approximately 700 angstrom. The procedure then forms a seventeenth resist R17 to cover the gate oxide film 112Gn and the side wall 119SW of the high-breakdown-voltage nMOS and the gate oxide film 112Gp and the side wall 119SW of the high-breakdown-voltage pMOS, and etches off the seventh oxide film 190 other than the part covered with the seventeenth resist R17. This gives a protective oxide film 190P for protecting the gate oxide film 112Gn and the side wall 119SW of the high-breakdown-voltage nMOS and the gate oxide film 112Gp and the side wall 119SW of the high-breakdown-voltage pMOS as shown in FIG. 38.

The additional seventeenth resist R17 is designed to cover the peripheral ends of the respective electrodes 160Hn and 160Hp by taking into account the accuracy of its dimensions. The protective oxide film 190P formed by etching accordingly covers the peripheral ends of the gate electrodes 160Hp and 160Hn.

The surface of the drain, gate, and source areas of the respective transistors is silicidated according to the process of FIGS. 27 and 28.

In the procedure of this embodiment, the thinner portions of the gate oxide films 112Gp and 112Gn are covered with and protected by the seventh oxide film 190 having the sufficient thickness of approximately 700 angstrom as shown in FIG. 38. The silicidation process of FIGS. 27 and 28 accordingly does not silicidate surface regions 126S$\alpha$, 128S$\alpha$, 136S$\alpha$, and 138S$\alpha$ of under-layer offset areas 126$\alpha$, 128$\alpha$, 136$\alpha$, and 138$\alpha$ in the thinner portions of the gate oxide films 112Gp and 112Gn as shown in FIG. 30.

As described above, like the basic manufacturing method discussed previously, the manufacturing method of the first embodiment enables both the high-breakdown-voltage transistor and the low-breakdown-voltage transistor to be efficiently formed on the identical substrate 100. The manufacturing method of the first embodiment effectively prevents a decrease in withstand voltage, which is the problem arising in the high-breakdown-voltage transistor manufactured by the basic manufacturing method.

Figure 39:
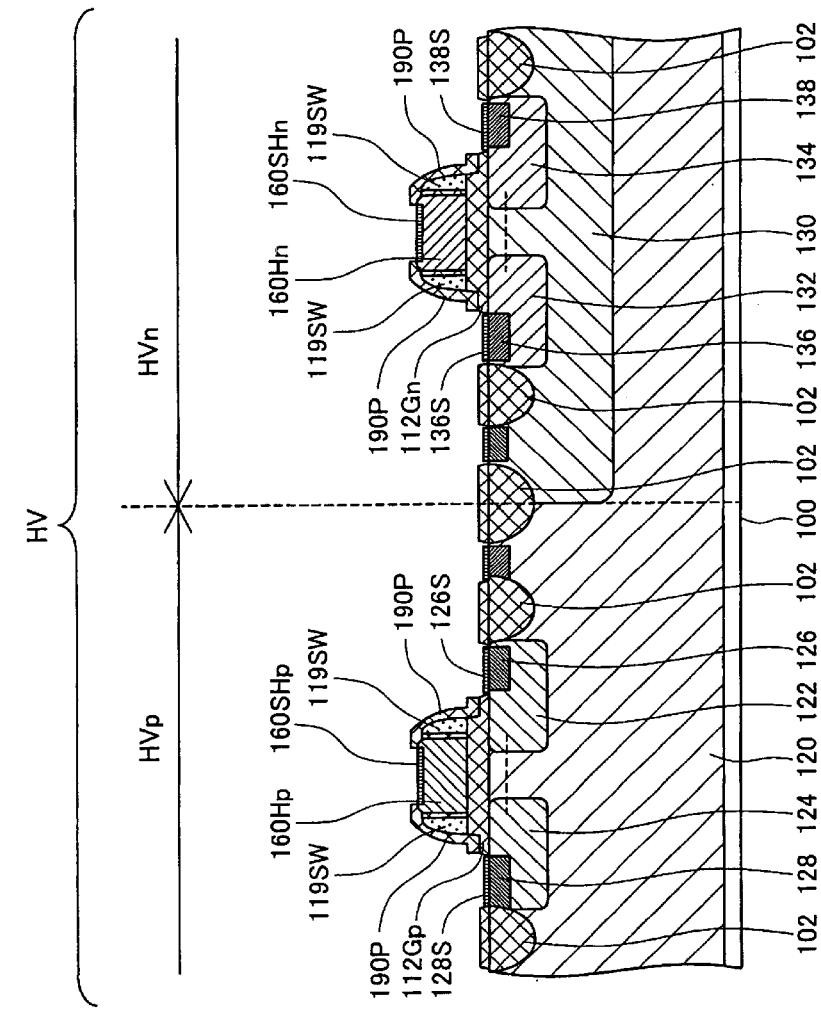
FIG. 39 is a sectional view schematically illustrating the structural features of a high-breakdown-voltage transistor manufactured according to the manufacturing method of the first embodiment.

FIG. 39 is a sectional view schematically illustrating the structural features of a high-breakdown-voltage transistor manufactured according to the manufacturing method of the first embodiment. Referring to FIG. 39, the protective oxide film 190P is formed to cover the gate oxide film 112Gp and the side wall 119SW of the high-breakdown-voltage pMOS. The protective oxide film 190P is designed to cover the peripheral end of the gate electrode 160Hp of the high-breakdown-voltage pMOS by taking into account the accuracy of dimensions, as discussed previously. The silicidated area 160SHp in the gate electrode 160Hp of the high-breakdown-voltage pMOS is accordingly only the opening not covered with the protective oxide film 190P. Namely there is a non-silicidated area in the peripheral end on the surface of the gate electrode 160Hp of the high-breakdown-voltage pMOS.

In a similar manner, the protective oxide film 190P is formed to cover the gate oxide film 112Gp and the side wall 119SW of the high-breakdown-voltage nMOS. The protective oxide film 190P is designed to cover the peripheral end of the gate electrode 160Hn of the high-breakdown-voltage nMOS. The silicidated area 160SHn in the gate electrode 160Hn of the high-breakdown-voltage nMOS is accordingly only the opening not covered with the protective oxide film 190P. Namely there is a non-silicidated area in the peripheral end on the surface of the gate electrode 160Hn of the high-breakdown-voltage nMOS.

D. Manufacturing Method of Second Embodiment

In order to solve the drawback of the high-breakdown-voltage transistor manufactured by the basic manufacturing method, a second embodiment of the present invention modifies part of the basic manufacturing method as discussed in the first embodiment with reference to FIGS. 31, 32, 37, and 38 and as shown in FIGS. 40 through 43. FIGS. 40 through 43 are sectional views schematically illustrating main processes in a method of manufacturing a semiconductor device as the second embodiment of the present invention.

The manufacturing method of the second embodiment changes the process of forming the gate oxide film of the high-breakdown-voltage transistor in the basic manufacturing method shown in FIGS. 11 and 12 into the process of FIGS. 31 and 32.

As discussed above in the first embodiment, after formation of the second oxide film 112 by thermal oxidation, the process of FIGS. 31 and 32 forms the resist R7A over the whole high-breakdown-voltage transistor area HV in order to protect the second oxide film 112 in the high-breakdown-voltage transistor area HV, and etches off only the second oxide film 112 in the low-breakdown-voltage transistor area LV. The oxide film, which is expected to function as a gate oxide film, is accordingly formed only in the high-breakdown-voltage transistor area HV.

The subsequent processes of the manufacturing method in this embodiment up to the process of forming the side walls shown in FIGS. 22 and 23 are similar to those in the basic manufacturing method discussed above. In the method of this embodiment, however, the whole surface of the oxide film is left intact in the high-breakdown-voltage transistor area HV. According to such difference, for example, the shape of the tenth resist R10 formed in the high-breakdown-voltage transistor area HV is changed in the process of forming the gate oxide film of the low-breakdown-voltage transistor shown in FIG. 15.

The manufacturing method of this embodiment changes the process of specifying the drain areas and the source areas of the high-breakdown-voltage transistor and the low-breakdown-voltage transistor shown in FIGS. 24 and 25 in the basic manufacturing method into a process of FIGS. 40 through 43. The concrete procedure of the embodiment separately carries out implantation of the impurity ion in the high-breakdown-voltage transistor and in the low-breakdown-voltage transistor, while the basic manufacturing method carries out implantation of the impurity ion simultaneously in the high-breakdown-voltage transistor and the low-breakdown-voltage transistor.

Figure 40:
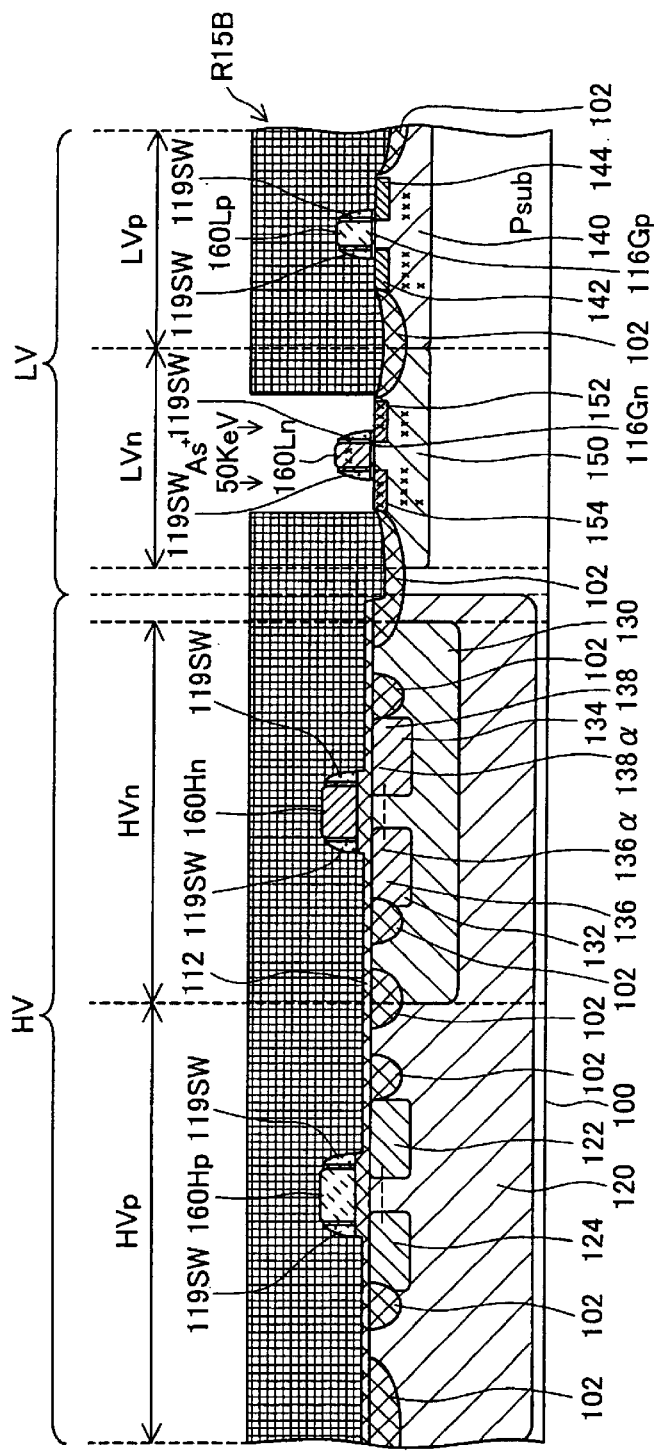
FIG. 40 is a sectional view schematically illustrating a process of specifying a drain area and a source area of a low-breakdown-voltage transistor, in a manufacturing method of a semiconductor device in a second embodiment of the present invention.

FIG. 40 is a sectional view schematically illustrating a process of specifying a drain area and a source area of a low-breakdown-voltage transistor in the manufacturing method of the embodiment. As clearly understood from the comparison with the process of FIG. 24, the fifteenth resist R15 is changed to a resist R15B in the process of FIG. 40. The resist R15B keeps open only the element forming region of the low-breakdown-voltage nMOS area LVn, while covering over the residual area including the element forming region of the high-breakdown-voltage nMOS area HVn. The procedure uses this resist R15B and implants the n-type impurity ion only into the element forming region of the low-breakdown-voltage nMOS area LVn.

Referring to FIG. 40, the concrete procedure forms the resist R15B over the whole area except the element forming region of the low-breakdown-voltage nMOS area LVn, and carries out implantation of the n-type impurity ion into the element forming region of the low-breakdown-voltage nMOS area LVn with the resist R15B as well as the gate electrode 160Ln and the side walls 119SW as the mask. In this embodiment, arsenic ion ($As^+$) having an energy level of 50 keV is implanted.

This causes the n-type impurity ion to be implanted into the drain-source forming regions in the element forming region of the low-breakdown-voltage nMOS area LVn.

Figure 41:
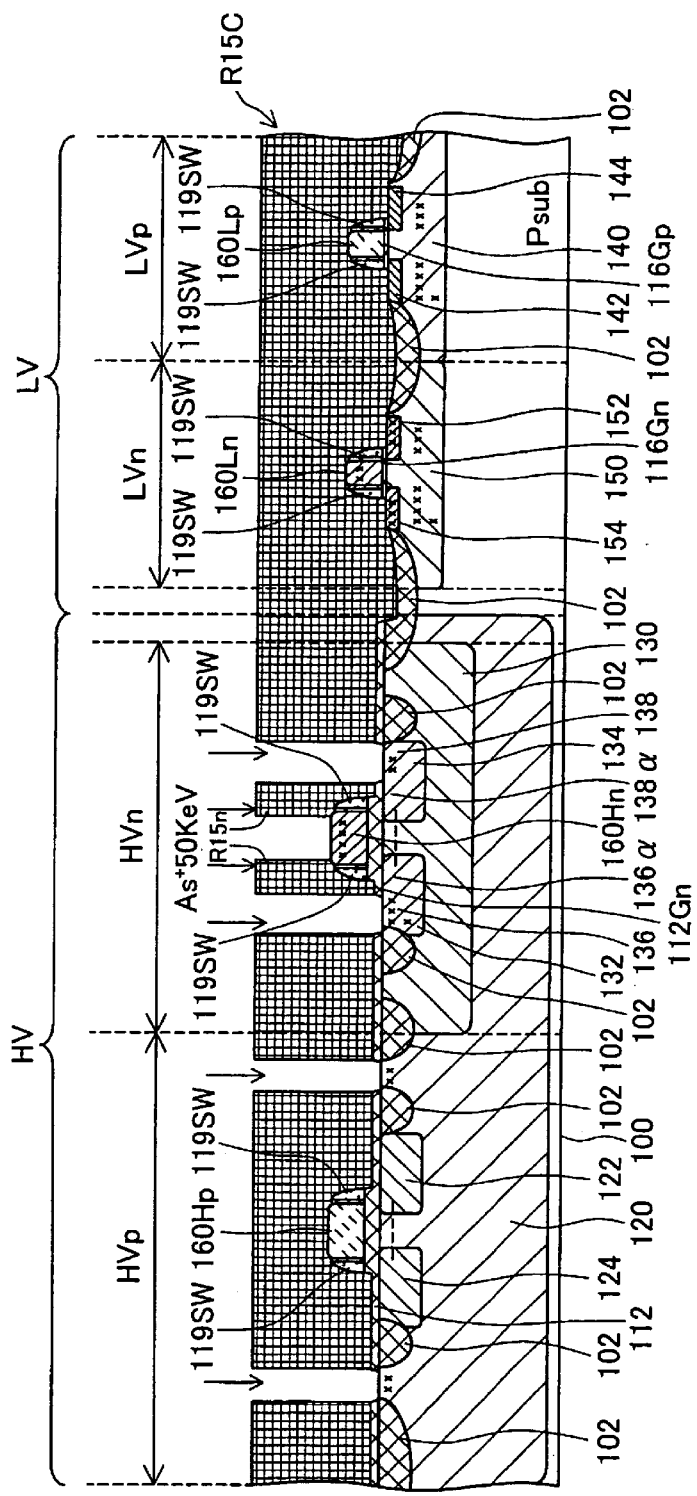
FIG. 41 is a sectional view schematically illustrating a process of specifying a drain area and a source area of a high-breakdown-voltage transistor in the manufacturing method of the second embodiment.

FIG. 41 is a sectional view schematically illustrating a process of specifying a drain area and a source area of a high-breakdown-voltage transistor in the manufacturing method of the embodiment. As clearly understood from the comparison with the process of FIG. 24, the fifteenth resist R15 is changed to a resist R15C in the process of FIG. 41. The resist R15C includes the resist R15n, which covers at least the side wall 119SW and the peripheral oxide film 112 in the high-breakdown-voltage nMOS area HVn. The resist R15C also covers the whole surface of the low-breakdown-voltage transistor area LV including the element forming region of the low-breakdown-voltage nMOS area LVn. The procedure of FIG. 41 uses this resist R15C and etches off non-required portions of the oxide film 112 in the high-breakdown-voltage transistor area HV. This makes drain-source forming regions open in the element forming region of the high-breakdown-voltage nMOS area HVn. The procedure does not remove the resist R15C but continuously uses the same resist R15C, and implants the n-type impurity ion into the open drain-source forming regions.

Referring to FIG. 41, the concrete procedure forms the resist R15C over the whole area other than the element forming region of the high-breakdown-voltage nMOS area HVn, and etches off non-required portions of the oxide film 112 in the high-breakdown-voltage transistor area HV with the resist R15C. This makes the drain-source forming regions open in the element forming region of the high-breakdown-voltage nMOS area HVn, and separates a gate oxide film 112Gn. The procedure subsequently carries out implantation of the n-type impurity ion with the resist R15C as the mask. In this embodiment, arsenic ion ($As^+$) having an energy level of 50 keV is implanted.

This causes the n-type impurity ion to be implanted into the drain-source forming regions in the element forming region of the high-breakdown-voltage nMOS area HVn.

Figure 42:
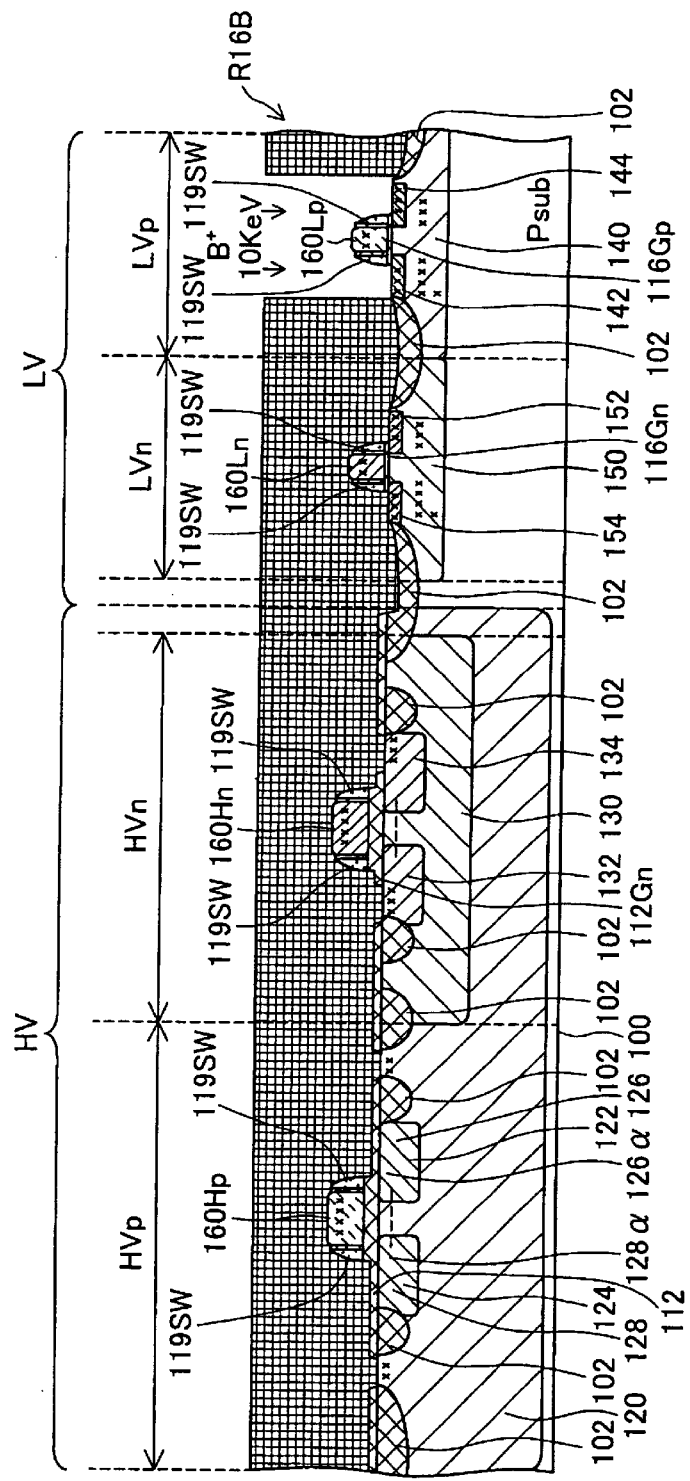
FIG. 42 is a sectional view schematically illustrating a process of specifying a drain area and a source area of a low-breakdown-voltage transistor in the manufacturing method of the second embodiment.

FIG. 42 is a sectional view schematically illustrating a process of specifying a drain area and a source area of a low-breakdown-voltage transistor in the manufacturing method of the embodiment. As clearly understood from the comparison with the process of FIG. 25, the sixteenth resist R16 is changed to a resist R16B in the process of FIG. 42. This resist R16B keeps open only the element forming region of the low-breakdown-voltage pMOS area LVp, while covering over the residual area including the element forming region of the high-breakdown-voltage pMOS area HVp. The procedure uses this resist R16B and implants the p-type impurity ion only into the element forming region of the low-breakdown-voltage pMOS area LVp.

Referring to FIG. 42, the concrete procedure forms the resist R16B over the whole area except the element forming region of the low-breakdown-voltage pMOS area LVp, and carries out implantation of the p-type impurity ion into the element forming region of the low-breakdown-voltage pMOS area LVp with the resist R16B as well as the gate electrode 160Lp and the side walls 119SW as the mask. In this embodiment, boron ion ($B^+$) having an energy level of 10 keV is implanted.

This causes the p-type impurity ion to be implanted into the drain-source forming regions in the element forming region of the low-breakdown-voltage pMOS area LVp.

Figure 43:
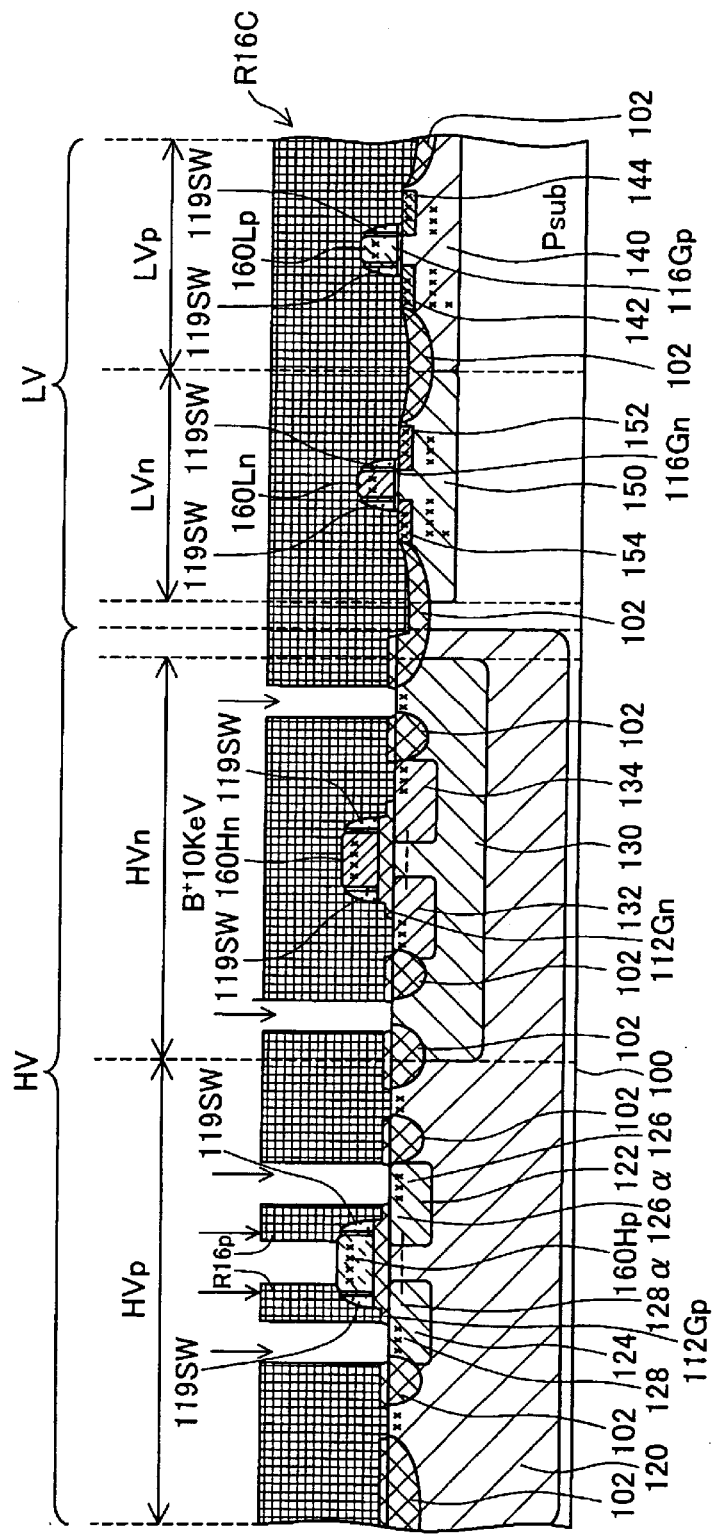
FIG. 43 is a sectional view schematically illustrating a process of specifying a drain area and a source area of a high-breakdown-voltage transistor in the manufacturing method of the second embodiment.

FIG. 43 is a sectional view schematically illustrating a process of specifying a drain area and a source area of a high-breakdown-voltage transistor in the manufacturing method of the embodiment. As clearly understood from the comparison with the process of FIG. 25, the sixteenth resist R16 is changed to a resist R16C in the process of FIG. 43. The resist R16C includes the resist R16p, which covers at least the side wall 119SW and the peripheral oxide film 112 in the high-breakdown-voltage pMOS area HVp. The resist R16C also covers the whole surface of the low-breakdown-voltage transistor area LV including the element forming region of the low-breakdown-voltage pMOS area LVp. The procedure of FIG. 43 uses this resist R16C and etches off non-required portions of the oxide film 112 in the high-breakdown-voltage transistor area HV. This makes drain-source forming regions open in the element forming region of the high-breakdown-voltage pMOS area HVp. The procedure does not remove the resist R16C but continuously uses the same resist R16C, and implants the p-type impurity ion into the open drain-source forming regions.

Referring to FIG. 43, the concrete procedure forms the resist R16C over the whole area other than the element forming region of the high-breakdown-voltage pMOS area HVp, and etches off non-required portions of the oxide film 112 in the high-breakdown-voltage transistor area HV with the resist R16C. This makes the drain-source forming regions open in the element forming region of the high-breakdown-voltage pMOS area HVp, and separates a gate oxide film 112Gp. The procedure subsequently carries out implantation of the p-type impurity ion with the resist R16C as the mask. In this embodiment, boron ion (B$^+$) having an energy level of 10 keV is implanted.

This causes the p-type impurity ion to be implanted into the drain-source forming regions in the element forming region of the high-breakdown-voltage pMOS area HVp.

Like the first embodiment, in the implantation process of the n-type impurity ion shown in FIG. 41, the resist R15$n$ of the resist R15C functions as the mask and effectively prevents the n-type impurity ion from being implanted into the under-layer offset areas 136α and 138α (see FIG. 29) in the thinner portions of the gate oxide film 112Gn. In a similar manner, in the implantation process of the p-type impurity ion shown in FIG. 43, the resist R16$p$ of the resist R16C functions as the mask and effectively prevents the p-type impurity ion from being implanted into the under-layer offset areas 126α and 128α (see FIG. 29) in the thinner portions of the gate oxide film 112Gp.

Like the first embodiment, the procedure of the second embodiment uses the resists R15C and R16C and makes the drain-source forming regions open in the element forming regions of the high-breakdown-voltage MOS areas in the process of FIGS. 41 and 43. The procedure does not remove the resists R15C and R16C but uses the same resists R15C and R16C and carries out implantation of the impurity ions into the open drain-source forming regions. There is accordingly no possibility of positional shift. This arrangement ensures accurate implantation of the impurity ions into the target regions.

The manufacturing method of the embodiment carries out implantation of the impurity ion into the low-breakdown-voltage transistor area LV separately from implantation of the impurity ion into the high-breakdown-voltage transistor area HV. In the process of FIGS. 41 and 43, the whole low-breakdown-voltage transistor area LV including the element forming regions of the low-breakdown-voltage MOS areas is covered with the resists R15C and R16C. The element forming regions of the low-breakdown-voltage MOS areas are not at all affected by etching with the resists R15C and R16C, which is performed to open the drain-source forming regions in the element forming regions of the high-breakdown-voltage MOS areas in the process of FIGS. 41 and 43. There is accordingly no possibility that part of the side walls 119SW defined by the oxide film is removed by etching.

In the process of FIGS. 40 through 43, the n-type impurity ion is implanted into the gate electrodes 160Hn and 160Ln of the nMOS, whereas the p-type impurity ion is implanted into the gate electrodes 160Hp and 160Lp of the pMOS. This arrangement desirably lowers the resistance of the respective gate electrodes 160Hn, 160Ln, 160Hp, and 160Lp.

In the process of FIGS. 41 and 43, the procedure of the embodiment also opens specific areas interposed between the LOCOS film-parts 102 other than the nMOS- and pMOS-forming regions in the high-breakdown-voltage transistor area HV by etching off the oxide film 112 with the resists R15C and R16C and implants the impurity ions into these areas with the same resists R15C and R16C. The arrangement of the embodiment thus ensures accurate implantation of the impurity ions into these areas interposed between the LOCOS film-parts 102 and desirably prevents insufficient isolation of the elements.

In the process of FIGS. 41 and 43, the resists R15$n$ and R16$p$ are designed to cover the peripheral ends of the respective electrodes 160Hn and 160Hp by taking into account the accuracy of its dimensions.

The ion implantation process of FIG. 40, the ion implantation process of FIG. 41, the ion implantation process of FIG. 42, and the ion implantation process of FIG. 43 may be carried out in a different order.

Like the first embodiment, the manufacturing method of the second embodiment additionally has the process of FIGS. 37 and 38 before the silicidation process of FIGS. 27 and 28 in the basic manufacturing method.

As described previously, the procedure of FIG. 37 makes the seventh oxide film 190 deposit over the whole surface of the substrate 100, forms the seventeenth resist R17 to cover the gate oxide film 112Gn and the side wall 119SW of the high-breakdown-voltage nMOS and the gate oxide film 112Gp and the side wall 119SW of the high-breakdown-voltage pMOS, and etches off the seventh oxide film 190 other than the part covered with the seventeenth resist R17. This gives the protective oxide film 190P for protecting the gate oxide film 112Gn and the side wall 119SW of the high-breakdown-voltage nMOS and the gate oxide film 112Gp and the side wall 119SW of the high-breakdown-voltage pMOS as shown in FIG. 38.

The surface of the drain, gate, and source areas of the respective transistors is silicidated according to the process of FIGS. 27 and 28.

In the procedure of this embodiment, the thinner portions of the gate oxide films 112Gp and 112Gn are covered with and protected by the seventh oxide film 190 having the sufficient thickness as shown in FIG. 38. The silicidation process of FIGS. 27 and 28 accordingly does not silicidate surface regions 126Sα, 128Sα, 136Sα, and 138Sα of under-layer offset areas 126α, 128α, 136α, and 138α in the thinner portions of the gate oxide films 112Gp and 112Gn as shown in FIG. 30.

As described above, like the basic manufacturing method discussed previously, the manufacturing method of the second embodiment enables both the high-breakdown-voltage transistor and the low-breakdown-voltage transistor to be efficiently formed on the identical substrate 100. The manufacturing method of the second embodiment effectively prevents a decrease in withstand voltage, which is the problem arising in the high-breakdown-voltage transistor manufactured by the basic manufacturing method.

The high-breakdown-voltage transistor manufactured by the manufacturing method of the second embodiment has similar structural features to those of the high-breakdown-voltage transistor shown in FIG. 39.

E. Modification

The above embodiments and their applications are to be considered in all aspects as illustrative and not restrictive. There may be many modifications, changes, and alterations without departing from the scope or spirit of the main characteristics of the present invention. All changes within the meaning and range of equivalency of the claims are therefore intended to be embraced therein.

For example, the procedure of the above embodiment forms the oxide film as the protective film for preventing silicidation of the thinner portions of the gate oxide films.

The protective film is, however, not restricted to the oxide film but may be any adequate film like a nitride film (for example, $Si_3N_4$).

The scope and spirit of the present invention are indicated by the appended claims, rather than by the foregoing description.

What is claimed is:

1. A method of manufacturing a semiconductor device, in which both a high-breakdown-voltage MOS transistor and a low-breakdown-voltage MOS transistor having different drain breakdown voltages are formed on an identical semiconductor substrate, the manufacturing method comprising the steps of:

(a) forming a gate electrode on a first dielectric film created above the substrate, creating a second dielectric film over surface of the substrate including the gate electrode, and etching the second dielectric film, so as to define a side wall of the second dielectric film on a side face of the gate electrode; and (b) implanting an impurity to specify a drain area and a source area, the step (b) comprising the sub-steps of:

(b-1) forming a first mask that keeps open at least a drain-source forming region in the high-breakdown-voltage MOS transistor, which is expected to form a drain area and a source area, and covers over at least an offset forming region in the high-breakdown-voltage MOS transistor, which is expected to form an offset area between the gate electrode and either one of the drain area and the source area;

(b-2) using the first mask and etching off a dielectric film part at least on the drain-source forming region, out of the dielectric film created on the substrate; and (b-3) continuously using the same first mask and implanting the impurity into the drain-source forming region.

2. A manufacturing method in accordance with claim 1, wherein the step (a) creates the second dielectric film in a greater thickness than a predetermined standard thickness, the sub-step (b-1) forming the first mask that keeps open an element forming region in the low-breakdown-voltage MOS transistor, on which an element is to be generated, in addition to the drain-source forming region, the sub-step (b-3) implanting the impurity into the element forming region as well as into the drain-source forming region.

3. A manufacturing method in accordance with claim 2, wherein the predetermined standard thickness is approximately 1300 angstrom.

4. A manufacturing method in accordance with claim 1, wherein the sub-step (b-1) forms the first mask that covers over an element forming region in the low-breakdown-voltage MOS transistor, on which an element is to be generated, in addition to the offset forming region, the step (b) further comprising the sub-steps of:

(b-4) forming a second mask that keeps open at least the element forming region in the low-breakdown-voltage MOS transistor; and (b-5) using the second mask and implanting the impurity into at least the element forming region.

5. A manufacturing method in accordance with claim 1, the manufacturing method further comprising the step of:

(c) forming a metal film on the gate electrode, the drain area, and the source area and carrying out heat treatment, so that at least part of semiconductor layers constructing the gate electrode, the drain area, and the source area is fused to a metal of the metal film and is thereby silicidated, the step (c) comprising the sub-step of:

(c-1) generating a protective film at least over the offset forming region.

6. A manufacturing method in accordance with claim 2, the manufacturing method further comprising the step of:

(c) forming a metal film on the gate electrode, the drain area, and the source area and carrying out heat treatment, so that at least part of semiconductor layers constructing the gate electrode, the drain area, and the source area is fused to a metal of the metal film and is thereby silicidated, the step (c) comprising the sub-step of:

(c-1) generating a protective film at least over the offset forming region.

7. A manufacturing method in accordance with claim 3, the manufacturing method further comprising the step of:

(c) forming a metal film on the gate electrode, the drain area, and the source area and carrying out heat treatment, so that at least part of semiconductor layers constructing the gate electrode, the drain area, and the source area is fused to a metal of the metal film and is thereby silicidated, the step (c) comprising the sub-step of:

(c-1) generating a protective film at least over the offset forming region.

8. A manufacturing method in accordance with claim 4, the manufacturing method further comprising the step of:

(c) forming a metal film on the gate electrode, the drain area, and the source area and carrying out heat treatment, so that at least part of semiconductor layers constructing the gate electrode, the drain area, and the source area is fused to a metal of the metal film and is thereby silicidated, the step (c) comprising the sub-step of:

(c-1) generating a protective film at least over the offset forming region.

* * * * *